United States Patent
Lukyanov et al.

(10) Patent No.: US 11,233,507 B2
(45) Date of Patent: Jan. 25, 2022

(54) HIGH FREQUENCY SWITCH FOR HIGH FREQUENCY SIGNAL TRANSMITTING/RECEIVING DEVICES

(71) Applicant: Samsung Electronics Co., Ltd., Gyeonggi-do (KR)

(72) Inventors: Anton Sergeevich Lukyanov, Moscow (RU); Elena Aleksandrovna Shepeleva, Kostroma (RU); Artem Yurievich Nikishov, Moscow Region (RU); Gennadiy Aleksandrovich Evtyushkin, Moscow (RU); Mikhail Nikolaevich Makurin, Arkhangelsk (RU); Kisoo Kim, Gyeonggi-do (KR); Dongil Yang, Gyeonggi-do (KR); Jongin Lee, Gyeonggi-do (KR)

(73) Assignee: Samsung Electronics Co., Ltd

( * ) Notice: Subject to any disclaimer, the term of this patent is extended or adjusted under 35 U.S.C. 154(b) by 229 days.

(21) Appl. No.: 16/454,688

(22) Filed: Jun. 27, 2019

(65) Prior Publication Data

US 2020/0007125 A1    Jan. 2, 2020

(30) Foreign Application Priority Data

Jun. 27, 2018  (RU) .......................... RU2018123298
Mar. 22, 2019  (KR) ........................ 10-2019-0033201

(51) Int. Cl.
*H03K 17/78*  (2006.01)
*H01L 31/09*  (2006.01)
(Continued)

(52) U.S. Cl.
CPC .............. *H03K 17/78* (2013.01); *H01L 31/09* (2013.01); *H01P 1/15* (2013.01); *H03K 17/56* (2013.01)

(58) Field of Classification Search
CPC ........ H03K 17/78; H03K 17/56; H03K 17/74; H01L 31/09; H01P 1/15; H01P 1/127; H01P 5/028
See application file for complete search history.

(56) References Cited

U.S. PATENT DOCUMENTS

| 3,678,414 A | 7/1972 | Hallford |
| 4,159,473 A | 6/1979 | Senk |

(Continued)

FOREIGN PATENT DOCUMENTS

| EP | 1 654 549 | 6/2012 |
| GB | 2493193 | 1/2013 |

(Continued)

OTHER PUBLICATIONS

International Search Report dated Oct. 15, 2019 issued in counterpart application No. PCT/KR2019/007838, 12 pages.

(Continued)

*Primary Examiner* — Thanh Luu
*Assistant Examiner* — Monica T Taba
(74) *Attorney, Agent, or Firm* — The Farrell Law Firm, P.C.

(57) ABSTRACT

Disclosed is a high frequency switch including a substrate, a pair of ground sections provided on the substrate, a center conductor provided between the pair of ground sections, and a photoconductive semiconductor element provided on the center conductor and extending between the center conductor and the pair of ground sections.

19 Claims, 21 Drawing Sheets

(51) Int. Cl.
  *H01P 1/15* (2006.01)
  *H03K 17/56* (2006.01)

(56) References Cited

U.S. PATENT DOCUMENTS

| | | | |
|---|---|---|---|
| 5,047,829 A * | 9/1991 | Seymour | H01L 23/53242 |
| | | | 257/656 |
| 5,536,977 A | 7/1996 | Williams | |
| 6,580,337 B1 | 6/2003 | Valas | |
| 6,717,496 B2 | 4/2004 | Feng et al. | |
| 7,009,195 B2 | 3/2006 | Nakano et al. | |
| 7,902,854 B2 | 3/2011 | Gunn et al. | |
| 8,290,445 B2 | 10/2012 | Sumita | |
| 8,569,164 B2 | 10/2013 | Park et al. | |
| 8,598,813 B2 | 12/2013 | Joshkin et al. | |
| 9,431,564 B2 | 8/2016 | Davies | |
| 9,716,202 B2 | 7/2017 | Curry et al. | |
| 9,851,826 B2 | 12/2017 | Fong | |
| 2002/0113759 A1 * | 8/2002 | Levine | H01Q 13/28 |
| | | | 345/55 |
| 2003/0015707 A1 | 1/2003 | Bosco et al. | |
| 2006/0097345 A1 | 5/2006 | Marr | |
| 2007/0092812 A1 | 4/2007 | Caporaso et al. | |
| 2007/0257256 A1 | 11/2007 | Kugler | |
| 2007/0290774 A1 | 12/2007 | Wyeth et al. | |
| 2009/0009853 A1 | 1/2009 | Tonucci | |
| 2013/0029453 A1 * | 1/2013 | Graham | H01L 31/03046 |
| | | | 438/93 |
| 2015/0221804 A1 * | 8/2015 | Curry | H01L 31/041 |
| | | | 257/431 |
| 2017/0166438 A1 | 6/2017 | Webb | |
| 2018/0358677 A1 | 12/2018 | Artemenko et al. | |

FOREIGN PATENT DOCUMENTS

| | | |
|---|---|---|
| RU | 2503087 | 12/2013 |
| RU | 148921 | 12/2014 |
| RU | 2600506 | 10/2016 |
| WO | WO 2007/059089 | 5/2007 |
| WO | WO 2012/115333 | 8/2012 |

OTHER PUBLICATIONS

Tawk, Y. et al., "Optically Pumped Frequency Reconfigurable Antenna Design", IEEE Antennas and Wireless Propagation Letters, vol. 9, 2010, Copyright 2010 IEEE, pp. 280-283.

Kowalczuk, Emma Kristina, Simulating, fabricating and characterising photoconductive microwave switches for RF application, Doctoral Thesis, Loughborough University . . . Institutional Repository, Apr. 2014, Copyright By Emma Kristina Kowalczuk 2014, https://dspace.lboro.ac.uk/2134/14968, pp. 250.

Alexander Weiran Pang et al., "An Optically Controlled Coplanar Waveguide Millimeter-Wave Switch", XP055820048, Jun. 13, 2018, 4 pages.

Joseph Flemish et al., "Optimization of a Photonically Controlled Microwave Switch and Attenuator", IEEE Transactions on Microwave Theory and Techniques, Oct. 2010, 7 pages.

Avanish Bhadauria et al., "Optical Control of Microstrip Stub on Silicon Substrate Using 650 nm and 850 nm Wavelengths Illumination", Sep. 9, 2008, 4 pages.

European Search Report dated Jul. 12, 2021 issued in counterpart application No. 19826407.9-1205, 12 pages.

* cited by examiner

HIGH FREQUENCY SWITCH FOR HIGH FREQUENCY SIGNAL TRANSMITTING/RECEIVING DEVICES

CROSS-REFERENCE TO RELATED APPLICATIONS

This application is based on and claims priority under 35 U.S.C. § 119 to Russian Patent Application No. 2018123298, filed on Jun. 27, 2018, in the Russian Patent Office, and Korean Patent Application No. 10-2019-0033201, filed on Mar. 22, 2019, in the Korean Intellectual Property Office, the disclosures of which are incorporated herein by reference in their entirety.

BACKGROUND

1. Field

The disclosure relates generally to switches, and more particularly, to optically controlled switches for high-frequency signal transmitting/receiving devices with very high operating frequencies.

2. Description of Related Art

A rapid growth in communication technologies is predicated upon the continuous evolution of user's needs. Currently, fifth generation partnership project (5G) millimeter wave (mmWave) networks are under development, which will exhibit higher performance in the user experience, including such factors as high transmission rate and power usage efficiency. 5G networks and car navigation sensors can change the scenario of wireless systems.

New mmWave applications require the introduction of a new class of circuits that can integrate data transmission and detection abilities in a single wireless device. Among the available technologies, an important role is played by devices implemented on printed circuit boards (PCBs), as they are simple in design and manufacture, can be economically integrated into a single dielectric substrate, have a suitable base for broadband implementation, and are easily combined with traditional PCB technologies.

Currently, PIN diodes, metal oxide semiconductor field effect transistor (MOSFET) devices, and micro-electromechanical systems (MEMS) are used as switching components in high frequency circuits. However, PIN diodes have a complex bias circuit (switching from positive current source to negative voltage), a MOSFET has high parasitic capacitance in low channel resistance, and a MEMS has a finite number of switching cycles and high control voltage.

As such, the existing switching technologies for high-frequency signal transmitting/receiving devices (keys, switches, phase shifters) are very sophisticated and therefore expensive, especially for frequencies over 10 GHz since they require miniaturization, cause radio frequency (RF) loss to be experienced due to intersection of RF channels with bias and DC supply circuits, are highly complex in terms of bias and supply circuits and occupy an excessive PCB area with bulky components, rendering integration into compact devices difficult.

The above problems can be overcome by an optically controlled component with a bias circuit galvanically isolated from an RF channel. In this case, a "decoupled" RF channel is provided. Therefore, additional frequency filtering circuits, which are required with conventional components, can be omitted.

Principle of operation of the optically controlled components is based on the photoconductivity effect, i.e. the ability of a semiconductor material to change its electrical characteristics by switching from a dielectric to conductive state depending on lighting. For example, a conventional photoconductive switch module provides a specific layer guiding light from light-emitting elements to photoconductive elements. However, the switching module has a bulky construction and consumes excessive power for lighting.

Furthermore, a photoconductive switch includes a photoconductive material and first and second contacts provided on said photoconductive material, wherein said first and second contacts comprise a plurality of interdigitated tracks that are separated from the tracks of the other contact by a photoconductive gap and are curved such that the minimum photoconductive gap measured in a first direction remains substantially similar regardless of the orientation of the first direction. A disadvantage of the switch, however, is the parasitic capacitance causing additional wave leaking and lower isolation. In addition, the switch is not suitable for complete blocking of mmWaves.

A microstrip diode high isolation switch is based on PIN diodes realizing a resultant obstacle into a broadband resonant circuit which may be switched between two states. When the diode is not conducting, the obstacle appears as an open circuit. However, in the Hallford switch the RF path circuits are disadvantageously coupled with bias and supply circuits of the PIN diodes, and the structure is rather bulky.

A microstrip single pole double throw switch incorporating multiple MEMS contacts includes first pair of contacts is located adjacent to the junction of input and output lines for optimization of performance bandwidth. The MEMS contacts that are not located adjacent to the junction are spaced along the output lines to further optimize the bandwidth and isolation in the OFF state, while minimizing insertion loss in the ON state. However, the switch is a complicated arrangement of bias and supply circuits, and is expensive and difficult to manufacture for high frequency applications.

Other microstrip radio frequency switches are based on a photoconductive switching element, which is series mounted in a microstrip line, such as in a stripline gap. In these switches, electric current is concentrated near semiconductor edges where electrical conductivity is low due to edge effects and respective surface recombination of carriers at the edges, while minimum current density is observed at the center of the microstrip where surface recombination is lower since it is technologically feasible to provide good surface quality of semiconductor material wafers from which these elements are made. As a consequence, high losses occur when electric current passes through the poorly conducting sections of the switch, and the switch requires a high optical power to switch to the ON state. In addition, the switch has a low blocking level due to parasitic capacitance.

Therefore, there is a need in the art to provide optically controlled switches for high-frequency signal transmitting/receiving devices with very high operating frequencies (up to about 100 GHz), which would simultaneously have low losses, low control power, a small size, and a simple supply/bias circuit to avoid spurious effects and low cost.

SUMMARY

An aspect of the disclosure is to address at least the above-mentioned problems and/or disadvantages and to provide at least the advantages described below. Accordingly, an aspect of the disclosure is to provide a high frequency switch having an improved blocking characteristic.

Another aspect of the disclosure is to provide is a high frequency switch requiring low-power.

In accordance with an aspect of the disclosure, a high frequency switch includes a substrate, a pair of ground sections provided on the substrate, a center conductor provided between the pair of ground sections, and a photoconductive semiconductor element provided on the center conductor and extending between the center conductor and the pair of ground sections.

In accordance with an aspect of the disclosure, a high frequency switch includes a pair of ground sections, a center conductor provided between the pair of ground sections, a photoconductive semiconductor element provided on the center conductor and extending between the center conductor and the pair of ground sections, and a light source irradiating control light on the photoconductive semiconductor element.

In accordance with an aspect of the disclosure, a high frequency switch includes a substrate, a photoconductive semiconductor element provided on the substrate, and a coplanar waveguide line provided between the substrate and the photoconductive semiconductor element, wherein, when control light is irradiated on the photoconductive semiconductor element, electromagnetic waves propagated to the coplanar waveguide line are reflected, and wherein, when the control light is blocked from being irradiated on the photoconductive semiconductor element, the electromagnetic waves are passed through the high frequency switch.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
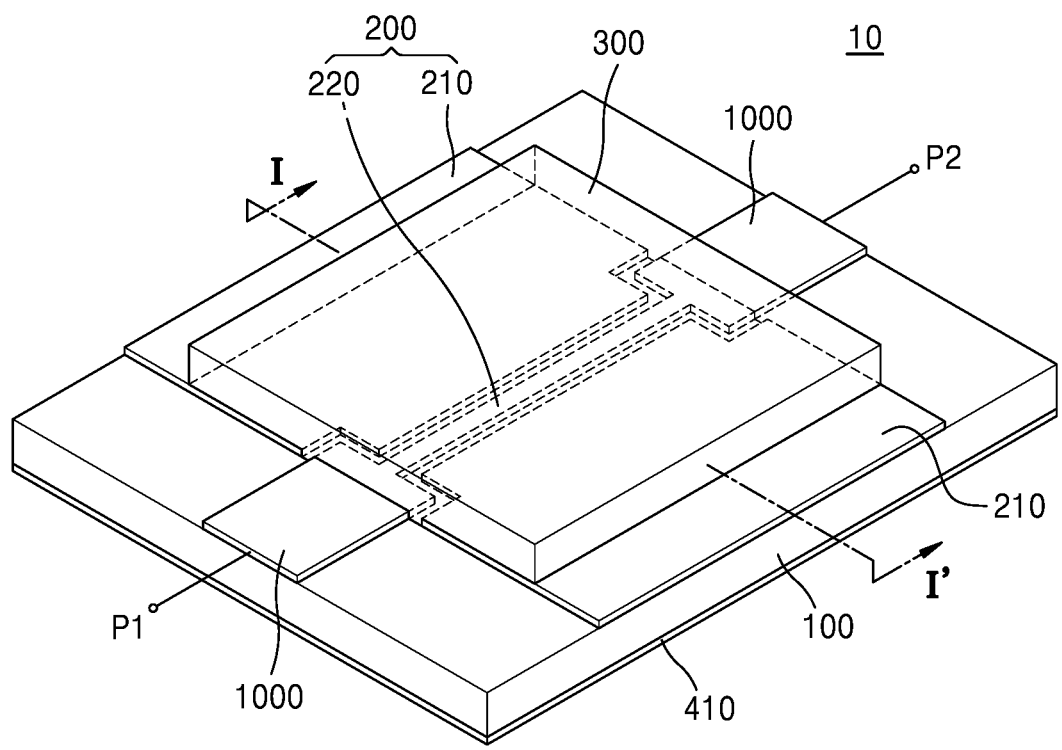
FIG. 1 illustrates a high frequency switch according to an embodiment.
Figure 1:
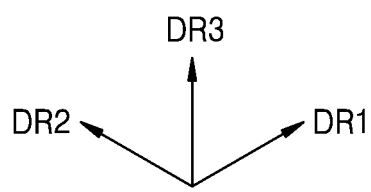

Hereinafter, embodiments of the disclosure will now be described with reference to accompanying drawings. In the drawings, like reference numerals refer to like elements, and a size of each component may be exaggerated for clarity and convenience. Embodiments of the disclosure described below are only examples and various modifications are possible. Detailed descriptions of known functions and configurations incorporated here will be omitted for the sake of clarity and conciseness.

The term "above" or "on" may denote a component being directly on and in contact with another component or being on (over) yet not in contact with the another component.

A singular expression includes a plural expression unless otherwise specified. When a part "includes" a component", the part may further include another component instead of excluding the other component, unless otherwise specified.

In addition, the term "unit" used herein denotes a unit processing at least one function or operation, and may be implemented by hardware, software, or a combination of hardware and software.

Throughout the disclosure, the expression "at least one of a, b or c" indicates only a, only b, only c, both a and b, both a and c, both b and c, all of a, b, and c, or variations thereof.

Figure 2A:
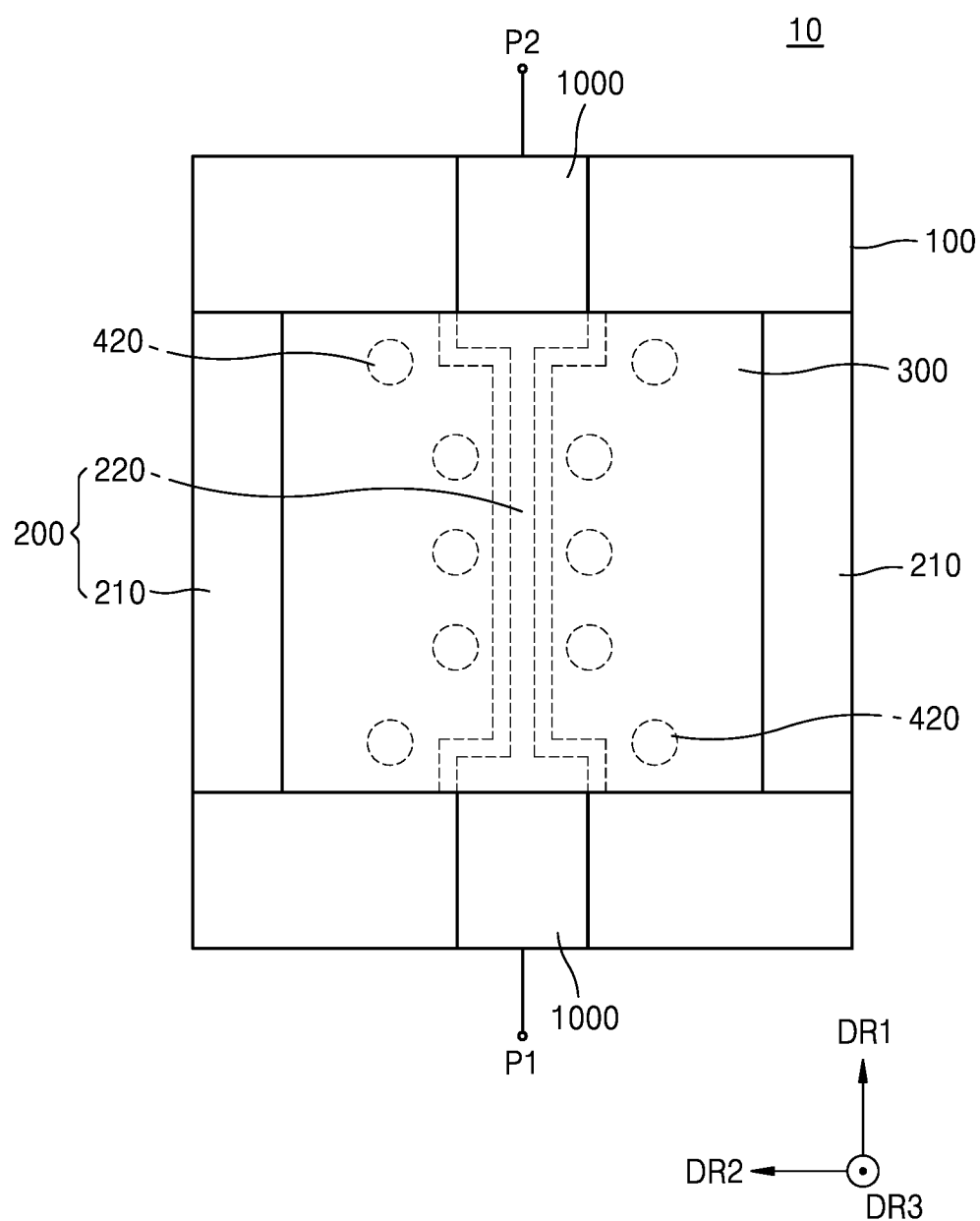
FIG. 2A is a plan view of FIG. 1.
Figure 2B:
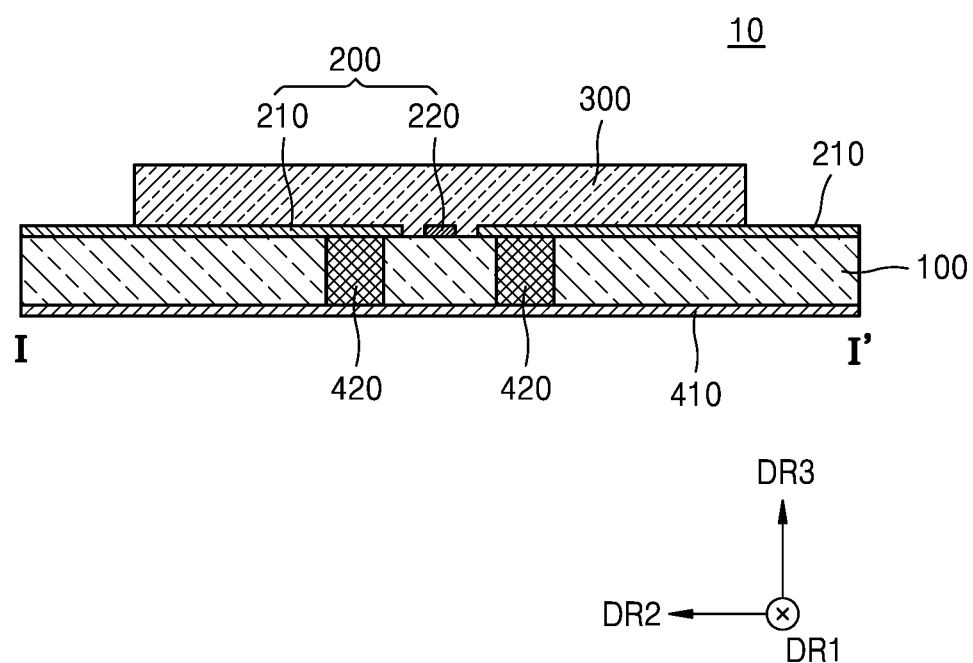
FIG. 2B is a cross-sectional view taken along line I-I' of FIG. 1.

FIG. 1 illustrates a high frequency switch 10 according to an embodiment. FIG. 2A is a plan view of FIG. 1. FIG. 2B is a cross-sectional view taken along line I-I' of FIG.

Referring to FIGS. 1, 2A and 2B, the high frequency switch 10 may include a substrate 100, a coplanar waveguide line 200, and a photoconductive semiconductor element 300. For example, the substrate 100 may include a PCB.

The coplanar waveguide line 200 may include a pair of ground sections 210 and a center conductor 220 between the pair of ground sections 210. The pair of ground sections 210 may extend in a first direction DR1 parallel to a top surface of the substrate 100, may face each other and be spaced apart from each other along a second direction DR2 that is parallel to the top surface of the substrate 100 and crosses the first direction DR1, and may include a conductive material, such as copper (Cu). A ground voltage may be applied to the pair of ground sections 210.

The center conductor 220 may be provided between the pair of ground sections 210. For example, the pair of ground sections 210 may be arranged from side to side on two side surfaces based on the center conductor 220, which may be linear, may extend along the first direction DR1, and may be spaced apart from the pair of ground sections 210 along the second direction DR2.

Distances between the center conductor 220 and the pair of ground sections 210 may be materially identical. The center conductor 220 may overlap the pair of ground sections 210 along the second direction DR2. A width of the center conductor 220 may be greater at both of its end portions than at its center portion, and may be a size of the center conductor 220 along the second direction DR2. The center conductor 220 may include a conductive material, such as Cu, and both end portions of the center conductor 220 may be electrically connected respectively to a pair of signal transmission lines 1000 described later, such as respectively directly contacting the pair of signal transmission lines.

The photoconductive semiconductor element 300 may be provided on the coplanar waveguide line 200, may cover the center conductor 220 and the pair of ground sections 210, may extend between the center conductor 220 and the pair of ground sections 210, may fill regions between the center conductor 220 and the pair of ground sections 210, and may contact the substrate 100 between the center conductor 220 and the pair of ground sections 210.

Conductivity of the photoconductive semiconductor element 300 may be adjusted by control light, and intrinsic electrical conductivity of the photoconductive semiconductor element 300 may be low. For example, the photoconductive semiconductor element 300 may intrinsically have a dielectric state (an OFF state of the high frequency switch 10), in which the photoconductive semiconductor element 300 may electrically disconnect the center conductor 220 and the pair of ground sections 210 from each other. When the control light is irradiated on the photoconductive semiconductor element 300, electrical conductivity of the photoconductive semiconductor element 300 may be increased. For example, when in a conductive state (an ON state of the high frequency switch 10), the photoconductive semiconductor element 300 may electrically connect the center conductor 220 and the pair of ground sections 210 to each other. The photoconductive semiconductor element 300 may include a semiconductor material having conductivity adjusted by the control light, such as silicon (Si), gallium-indium arsenide, or a combination thereof.

A bottom ground layer 410 may be provided opposite to the coplanar waveguide line 200 with the substrate 100 therebetween. The bottom ground layer 410 may cover a bottom surface of the substrate 100. The bottom ground layer 410 may include a conductive material. For example, the lower ground layer 410 may include a metal, such as Cu, and a ground voltage may be applied to the bottom ground layer 410.

Vias 420 may be provided between the pair of ground sections 210 and the bottom ground layer 410 and may electrically connect the pair of ground sections 210 and the bottom ground layer 410 to each other. For example, the vias 420 may directly contact the pair of ground sections 210 and the bottom ground layer 410, may penetrate the substrate 100, may extend along a third direction DR3 perpendicular to the top surface of the substrate 100, and may include a conductive material, such as Cu.

The pair of signal transmission lines 1000 may be provided on the substrate 100, may be spaced apart from each other with the high frequency switch 10 therebetween, and may be respectively electrically connected to both end portions of the center conductor 220. For example, the pair of signal transmission lines 1000 may respectively directly contact the both end portions of the center conductor 220. A width of each of the pair of signal transmission lines 1000 may be materially identical to a width of each of the both end portions of the center conductor 220, and may be greater than a width of a center portion of the center conductor 220. One of the pair of signal transmission lines 1000 may be connected to a first port P1. The other one of the pair of signal transmission lines 1000 may be connected to a second port P2. The pair of signal transmission lines 1000 may include a conductive material, such as Cu.

A size characteristic of the coplanar waveguide line 200 may be determined to provide wave impedance identical to an impedance of the pair of signal transmission lines 1000, such as 50Ω. For example, the size characteristic of the coplanar waveguide line 200 may include the width of the center conductor 220 and a distance between the center conductor 220 and the pair of ground sections 210. A dielectric constant of the photoconductive semiconductor element 300 may be considered while determining the size characteristic of the coplanar waveguide line 200. The pair of signal transmission lines 1000 and the high frequency switch 10 may be identical. As a result, when the high frequency switch 10 is in the OFF state, electromagnetic wave (signal) may propagate with minimal loss.

The disclosure may provide the high frequency switch 10 using the photoconductive semiconductor element 300 having conductivity adjusted by control light. The high frequency switch 10 may include a minimal number of components. Accordingly, complexity, size, manufacturing costs, and power consumption of the high frequency switch 10 may be decreased. The high frequency switch 10 may be used in a wide frequency range (maximum 100 GHz) and may have low mmWave loss. The first and second ports P1 and P2 may be electrically disconnected from supply/bias circuits of the high frequency switch 10, which may have a high blocking performance.

Figure 3:
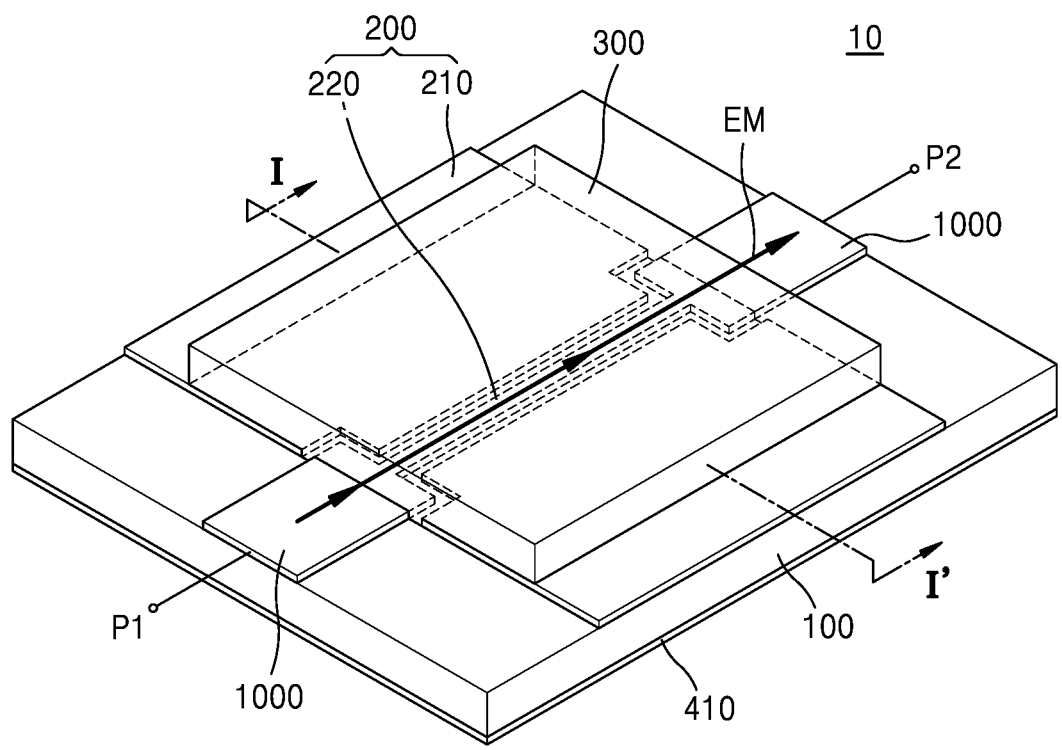
FIG. 3 illustrates an OFF state of the high frequency switch of FIGS. 1, 2A and 2B.
Figure 3:
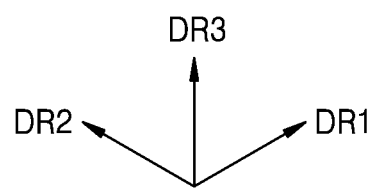
Figure 4:
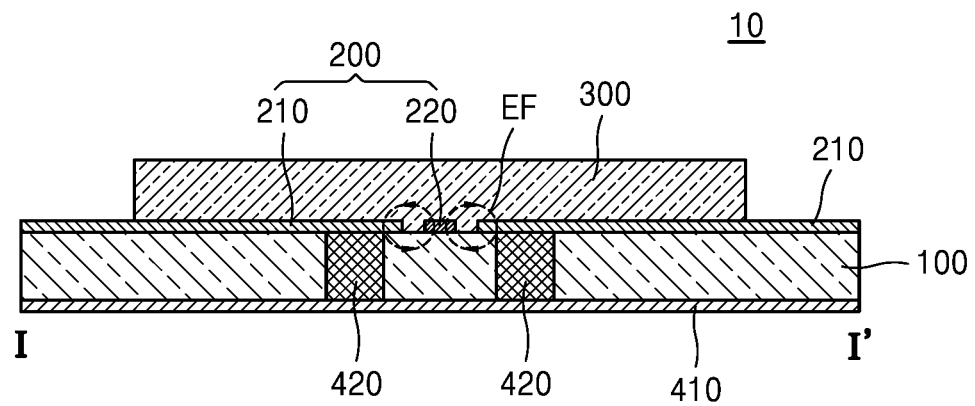
FIG. 4 is a cross-sectional view taken along line I-I' of FIG. 3.
Figure 4:
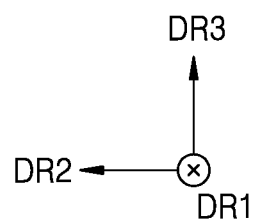
Figure 5:
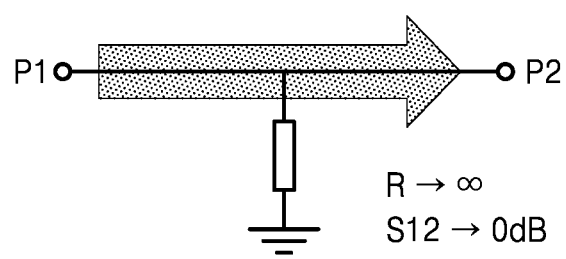
FIG. 5 is an equivalent circuit of FIG. 3.

FIG. 3 illustrates an OFF state of the high frequency switch 10 of FIGS. 1, 2A and 2B. FIG. 4 is a cross-sectional view taken along line I-I' of FIG. 3. FIG. 5 is an equivalent circuit of FIG. 3.

Referring to FIGS. 3 and 4, the high frequency switch 10 may be in the OFF state. The photoconductive semiconductor element 300 may be in the dielectric state. The center conductor 220 and the pair of ground sections 210 may be electrically disconnected from each other by the photoconductive semiconductor element 300. The pair of signal transmission lines 1000 and the high frequency switch 10 may, impedance match each other. Accordingly, when the high frequency switch 10 is in the OFF state, electromagnetic (EM) waves may propagate through the high frequency switch 10 with minimal loss, and electric fields (EF) may be formed between the center conductor 220 and the pair of ground sections 210.

Referring to FIG. 5, the electromagnetic waves EM of FIG. 3 may propagate from the first port P1 to the second port P2 through the high frequency switch 10 of FIG. 3. A transmission factor S12 between the first port P1 and the second port P2 may be 0 dB and may indicate loss of EM's when the EM's propagate from the first port P1 to the second port P2. The parallel resistance R may have a very large value, such as a value close to infinity (∞).

Figure 6:
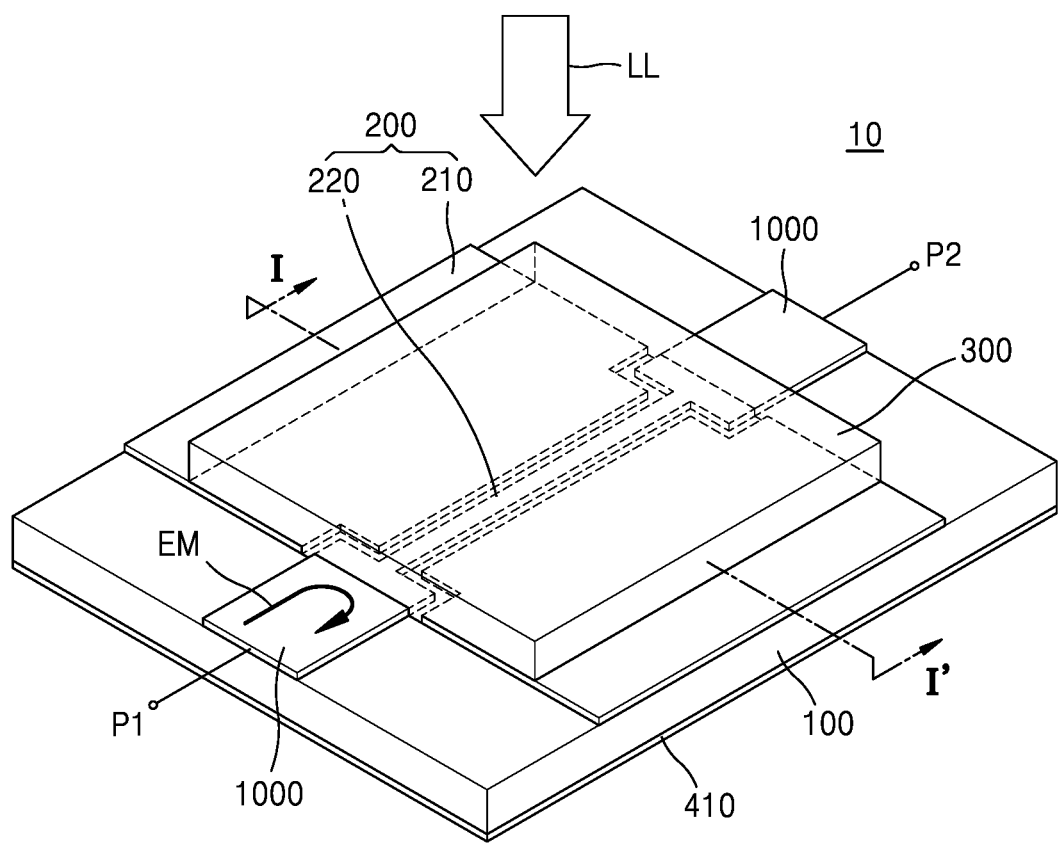
FIG. 6 illustrates an ON state of the high frequency switch of FIGS. 1, 2A and 2B.
Figure 6:
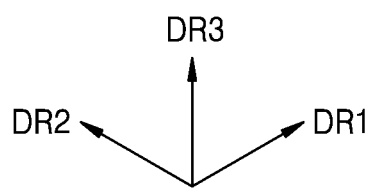
Figure 7:
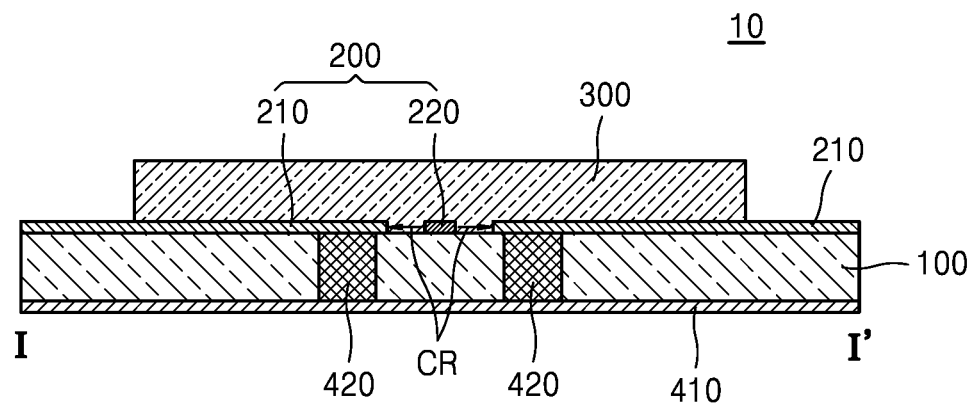
FIG. 7 is a cross-sectional view taken along line I-I' of FIG. 6.
Figure 7:
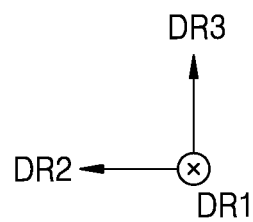
Figure 8:
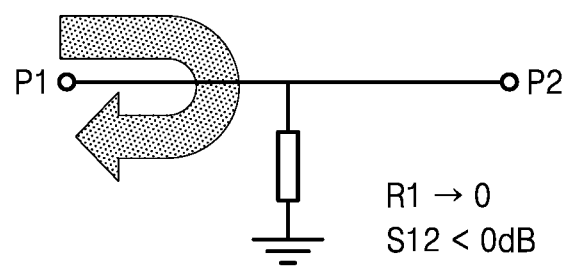
FIG. 8 is an equivalent circuit of FIG. 6.

FIG. 6 illustrates an ON state of the high frequency switch 10 of FIGS. 1, 2A and 2B. FIG. 7 is a cross-sectional view taken along line I-I' of FIG. 6. FIG. 8 is an equivalent circuit of FIG. 6.

Referring to FIGS. 6 and 7, control light (LL) may be irradiated on the photoconductive semiconductor element 300 by being provided from the outside of the photoconductive semiconductor element 300. Accordingly, the photoconductive semiconductor element 300 may have a conductive state. The center conductor 220 and the pair of ground sections 210 may be electrically connected to each other by the photoconductive semiconductor element 300. When the EM's propagate from the first port P1 to the high frequency switch 10, a current (CR) may pass through the photoconductive semiconductor element 300 between the center conductor 220 and the pair of ground sections 210. Accordingly, a forward wave propagation condition of the high frequency switch 10 may be broken and a reverse wave propagation condition (i.e., a reflection condition) of the high frequency switch 10 may be created. As a result, the EM's may be reflected by the high frequency switch 10. Supply/bias circuits of the high frequency switch 10 may be separated from an RF wave path. The degree of reflection may be adjusted by control light power.

Each of the photoconductive semiconductor elements 300 between the center conductor 220 and the pair of ground sections 210 may be identical to a parallel resistor for which resistance is calculated by Equation (1), as follows.

$$R \approx L/(\sigma S) \qquad (1)$$

In Equation (1), R denotes resistance of a parallel resistor, σ denotes conductivity of a photoconductive semiconductor element under control light, L denotes a length of a region through which a current passes (i.e., a width of a gap or distance between the center conductor 220 and the pair of ground sections 210), and S denotes a sectional area of a region through which a current passed along planar waveguide line.

The current CR may flow from the center conductor 220 to the pair of ground sections 210 in the coplanar waveguide line 200. The sectional area S of the region through which the current CR passed along the coplanar waveguide line 200 may be a product of multiplying the length of the center conductor 220 and the thickness of the center conductor 220. The sectional area S of the region through which the current CR passed through along the coplanar waveguide line 200 may depend on the length of the center conductor 220. When combined resistance by the photoconductive semiconductor elements 300 between the center conductor 220 and the pair of ground sections 210 is minimal, blocking performance of the high frequency switch 10 may be high, and therefore, may be defined by the length of the center conductor 220.

Referring to FIG. 8, the equivalent circuit of the photoconductive semiconductor element 300 in the ON state is shown. The EM's propagated to the high frequency switch from the first port P1 may be reflected by the high frequency switch. The transmission factor S12 between the first port P1 and the second port P2 may be less than 0 dB. The parallel resistance R1 may have a value close to zero.

Figure 9:
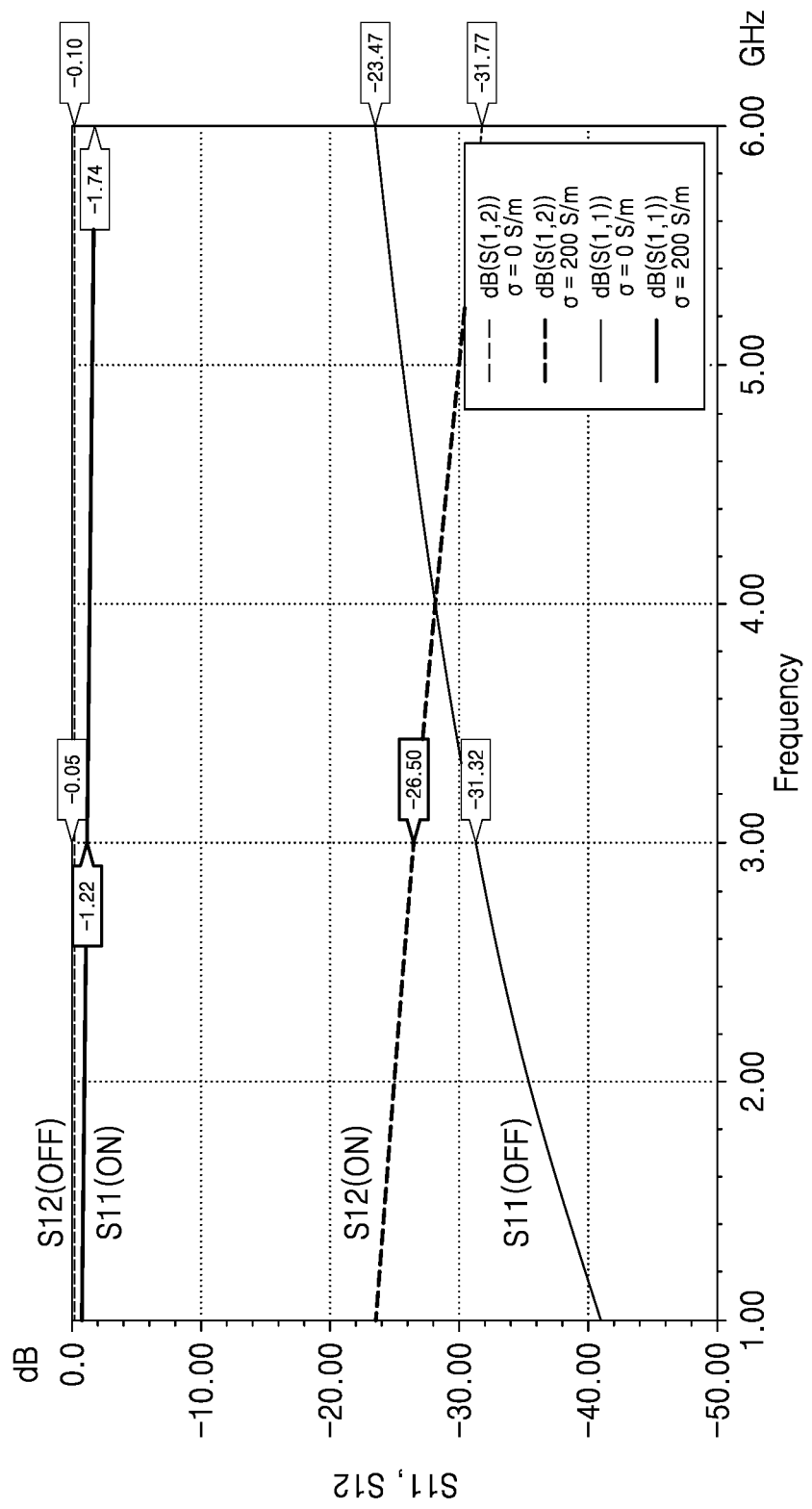
FIG. 9 illustrates a simulation result of an operation of the high frequency switch of FIGS. 1, 2A and 2B.

FIG. 9 illustrates a simulation result regarding the ON state and the OFF state of the high frequency switch 10 of FIGS. 1, 2A and 2B.

Referring to FIG. 9, transmission factors S12 and reflection factors S11 according to the ON state and the OFF state of the high frequency switch 10 described with reference to FIGS. 1, 2A and 2B are shown. The transmission factors S12 indicate loss of the EM's when the high frequency switch 10 is in the OFF state. The reflection factors S11 indicate loss of the EM's when the high frequency switch 10 has the ON state. Dashed lines indicate the transmission factors S12 and solid lines indicate the reflection factors S11.

When the high frequency switch 10 is in the ON state (i.e., when control light is irradiated on the photoconductive semiconductor element 300), the conductivity of the photoconductive semiconductor element 300 is 200 S/m, and a significant part of signal power is reflected. At a signal frequency of 6 GHz, loss of a transmitted signal is over 31 dB and loss of a reflected signal is 1.74 dB.

When the high frequency switch 10 is in the OFF state (i.e., when there is no control light), the conductivity of the photoconductive semiconductor element 300 is 0 S/m, and most of signal power is transmitted from the first port P1 to the second port P2. At the signal frequency of 6 GHz, the loss of the transmitted signal is 0.1 dB and the loss of the reflected signal is 23 dB.

Figure 10:
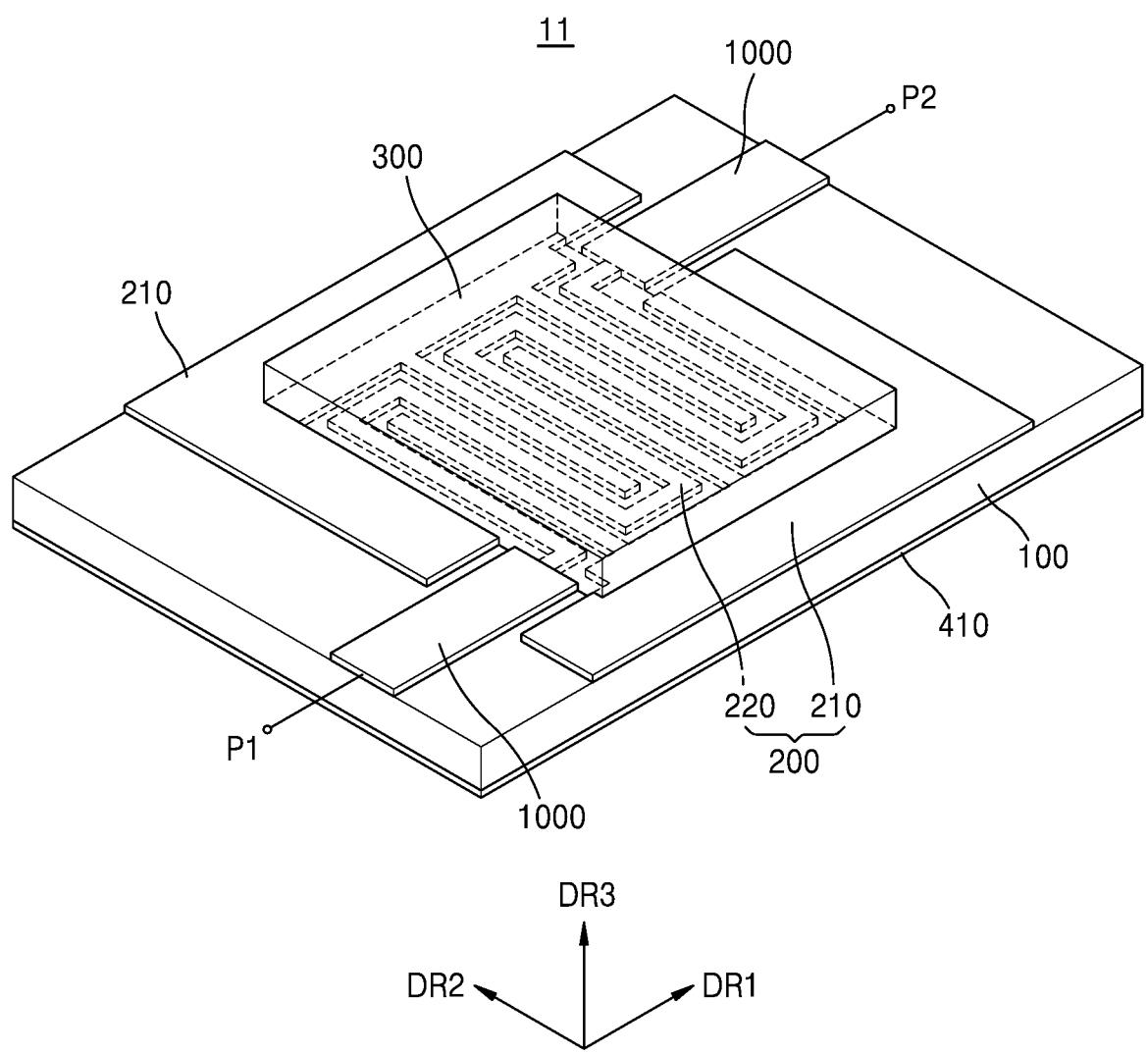
FIG. 10 illustrates a high frequency switch according to an embodiment.
Figure 11:
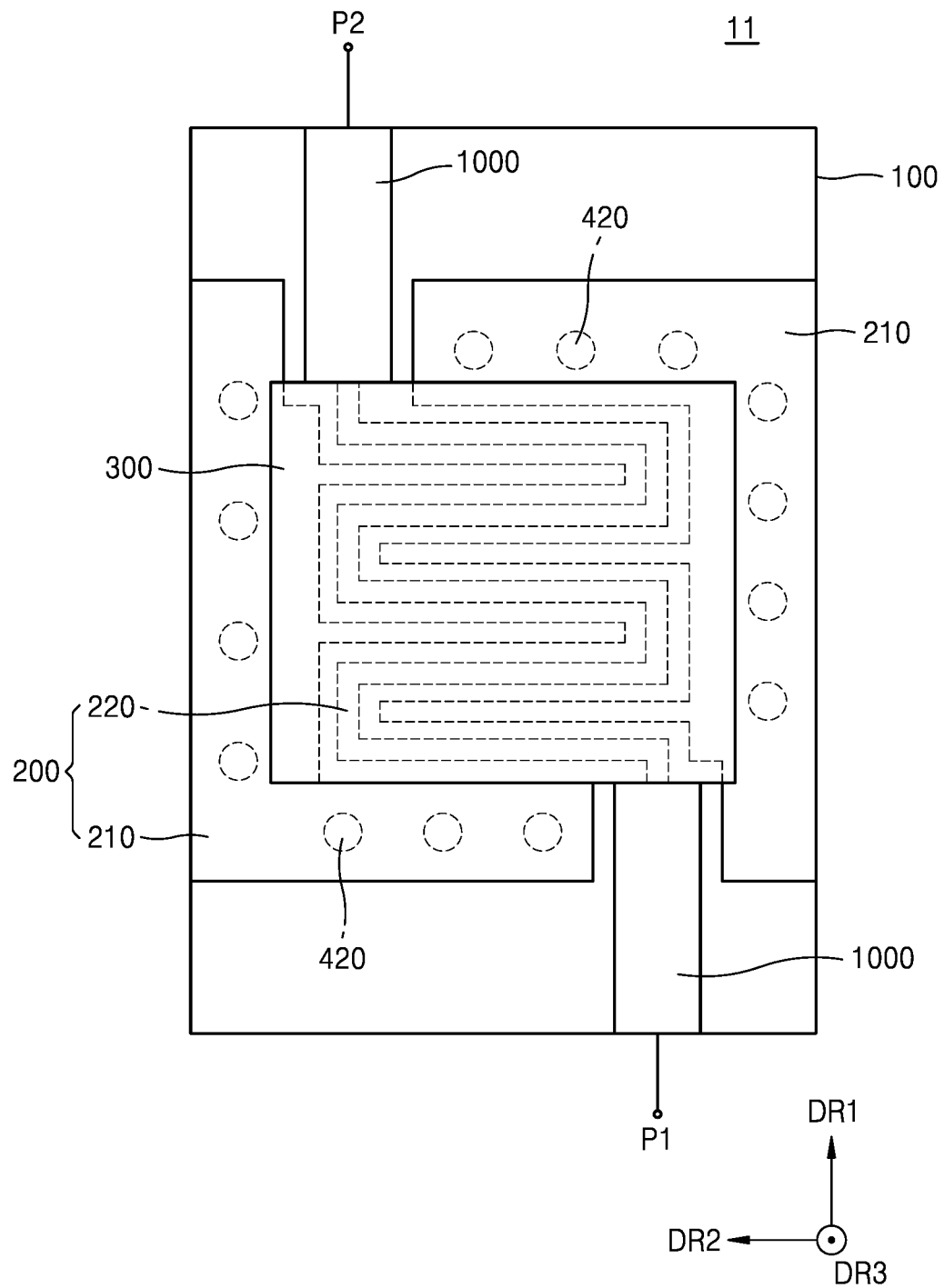
FIG. 11 is a plan view of FIG. 10.
Figure 12:
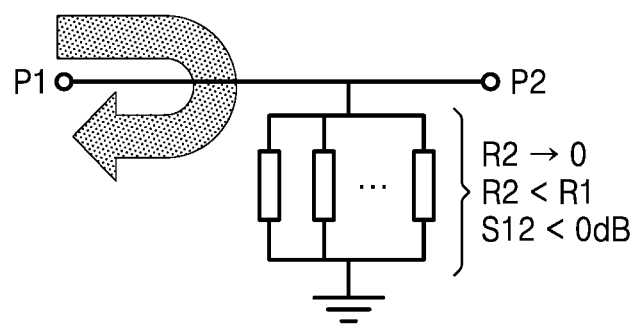
FIG. 12 is an equivalent circuit of a high frequency switch in an ON state.

FIG. 10 illustrates a high frequency switch 11 according to an embodiment. FIG. 11 is a plan view of FIG. 10. FIG. 12 is an equivalent circuit of the high frequency switch 11 in an ON state. For conciseness, descriptions that are similar to those of FIGS. 1, 2A and 2B are not repeated.

Unlike in FIGS. 1 and 2A, referring to FIGS. 10 and 11, the center conductor 220 may be non-linear, such as having a winding shape. A length of the non-linear center conductor 220 may be longer than the length of the linear center conductor 220.

The pair of ground sections 210 may have a shape corresponding to the center conductor 220 such that the distances between the center conductor 220 and the pair of ground sections 210 are uniform.

The regions between the center conductor 220 and the pair of ground sections 210 may be longer when the center conductor 220 is non-linear than when the center conductor 220 is linear. Accordingly, the photoconductive semiconductor element 300 provided between the center conductor 220 and the pair of ground sections 210 may also be longer when the center conductor 220 is non-linear than when the center conductor 220 is linear. When the lengths of the pair of ground sections 210 are increased, the combined resistance by the photoconductive semiconductor elements between the center conductor 220 and the pair of ground sections 210 may be decreased, thereby improving blocking performance of the high frequency switch 11.

FIG. 12 illustrates the equivalent circuit of the high frequency switch in the ON state. Electromagnetic waves propagated from the first port P1 to the high frequency switch may be reflected by the high frequency switch. The transmission factor S12 between the first port P1 and the second port P2 may be less than 0 dB. A parallel resistance R2 may be the equivalent resistance of subparallel resistances R1 connected in parallel. The parallel resistance R2 may be smaller than the sub-parallel resistance R1, and may have a value close to zero.

Figure 13:
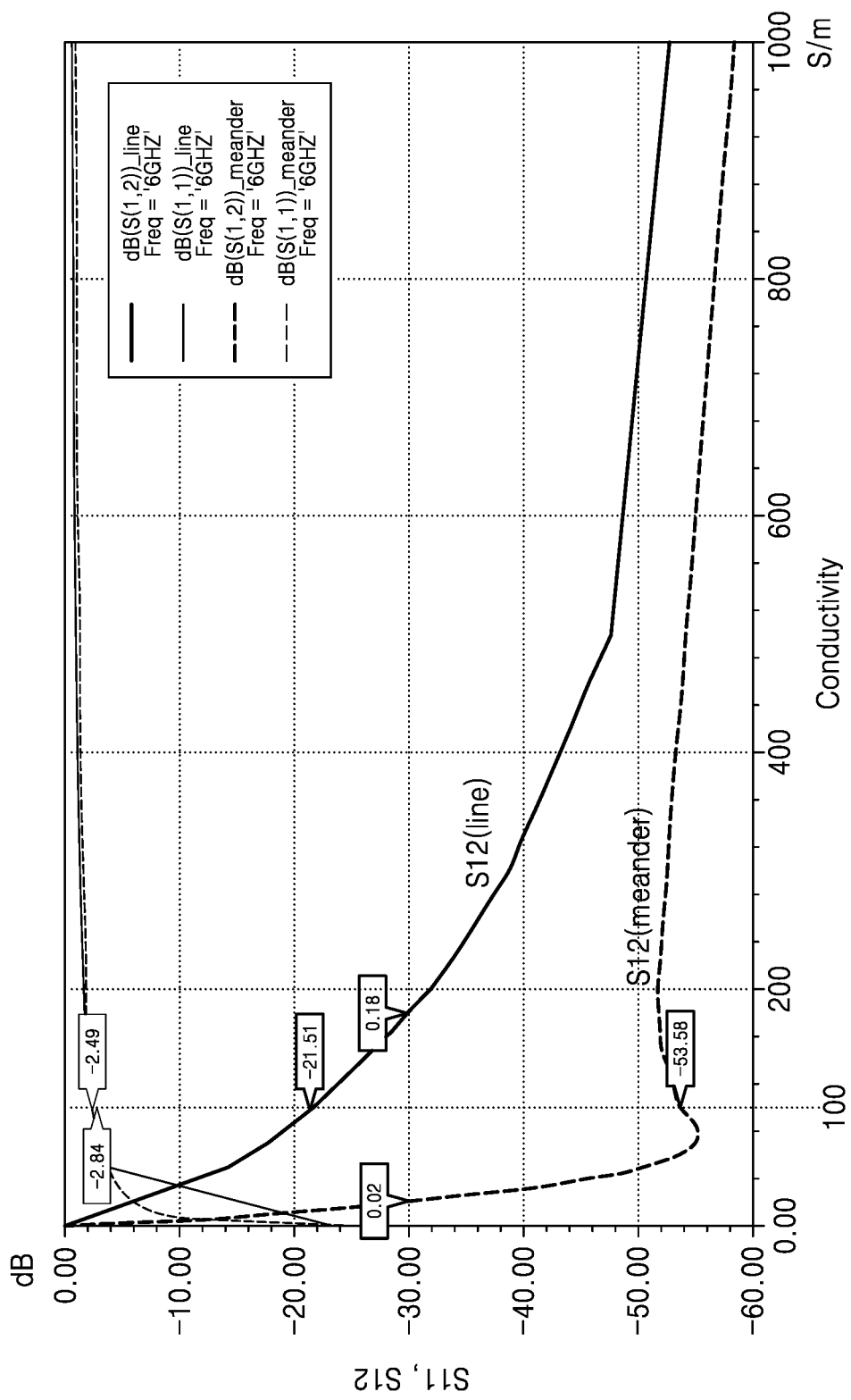
FIG. 13 illustrates the simulation result of the operation of the high frequency switch described with reference to FIGS. 1, 2A and 2B and a simulation result of an operation of the high frequency switch described with reference to FIGS. 10 and 11.

FIG. 13 illustrates the simulation results of the operations of the high frequency switches 10 and 11.

Referring to FIG. 13, the comparison graph of the transmission factors S12 and the reflection factors S11 of the high frequency switch 10 described with reference to FIGS. 1, 2A and 2B and the high frequency switch 11 described with reference to FIGS. 10 and 11 is shown. The center conductor 220 described with reference to FIGS. 10 and 11 (hereinafter, referred to as the non-linear center conductor 220) may be longer than the center conductor 220 described with reference to FIGS. 1, 2A and 2B (hereinafter, referred to as the linear center conductor 220). For example, the non-linear center conductor 220 may have a winding shape that may extend in the first direction DR1.

Dashed lines relate to the operation of the high frequency switch 11 including the non-linear center conductor 220 and solid lines relate to the operation of the high frequency switch 10 including the linear center conductor 220. When the signal frequency is 6 GHz and the conductivity of the photoconductive semiconductor element 300 is 100 S/m, the transmission factor S12 of the high frequency switch 11 in the ON state including the non-linear center conductor 220 is about −21 dB. When the signal frequency is 6 GHz and the photoconductive semiconductor element 300 is 100 S/m, the transmission factor S12 of the high frequency switch 10 in the ON state including the linear center conductor 220 is about −53 dB or more. The high frequency switch 11 in the ON state including the non-linear center conductor 220 has improved blocking performance than the high frequency switch 10 in the ON state including the linear center conductor 220.

Figure 14:
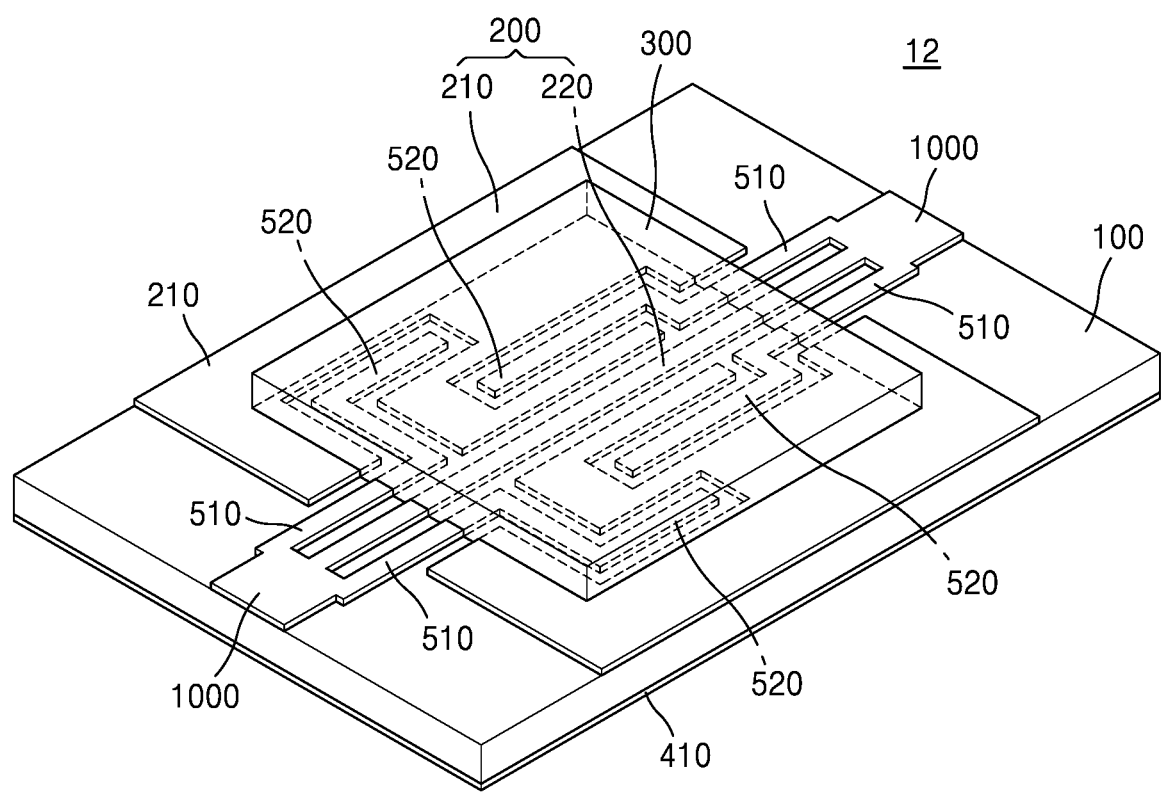
FIG. 14 illustrates a high frequency switch according to an embodiment.
Figure 14:
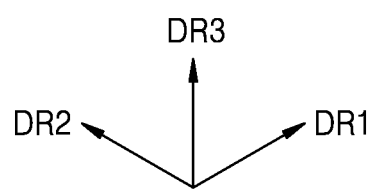
Figure 15:
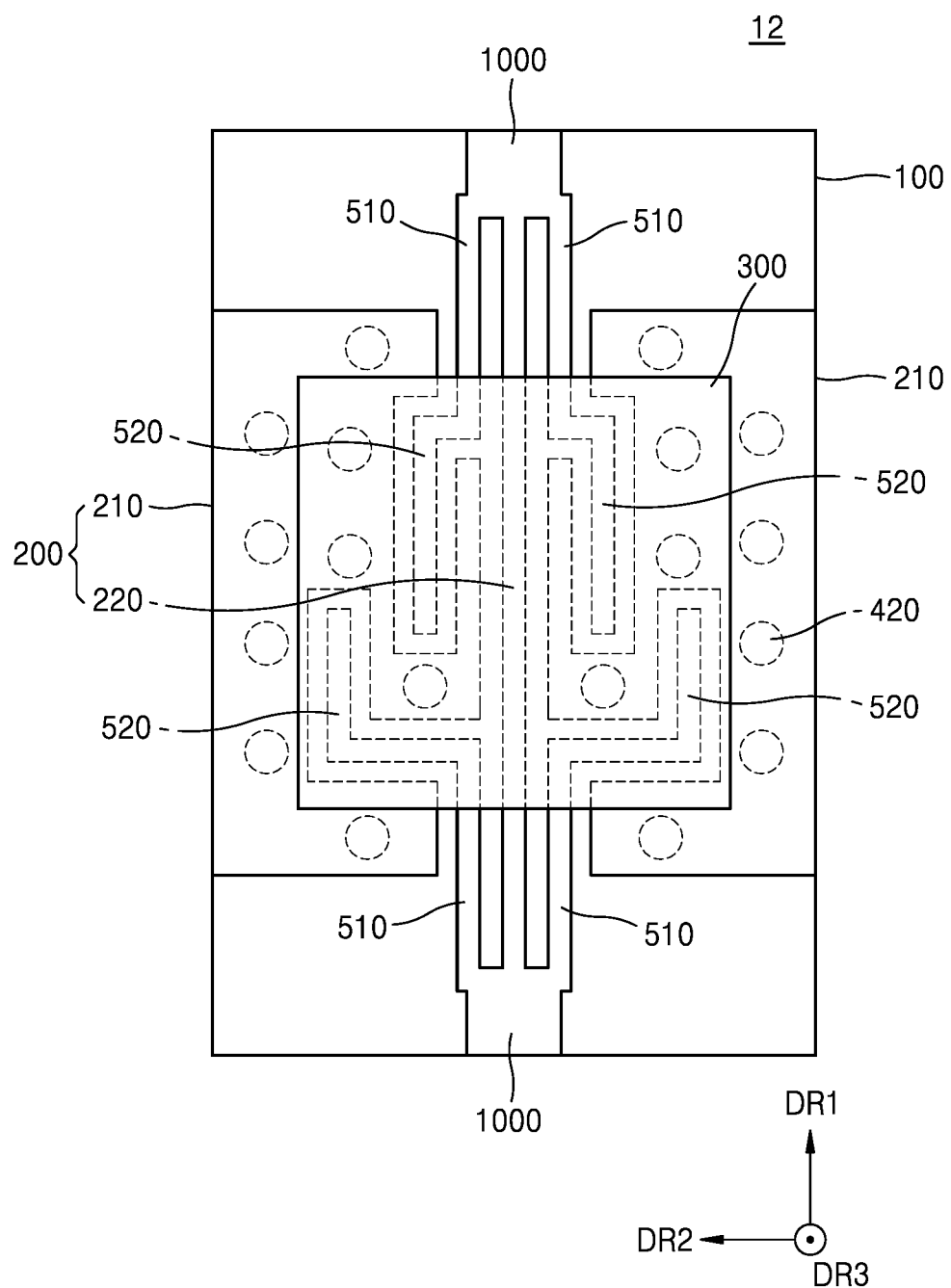
FIG. 15 is a plan view of FIG. 14.
Figure 16:
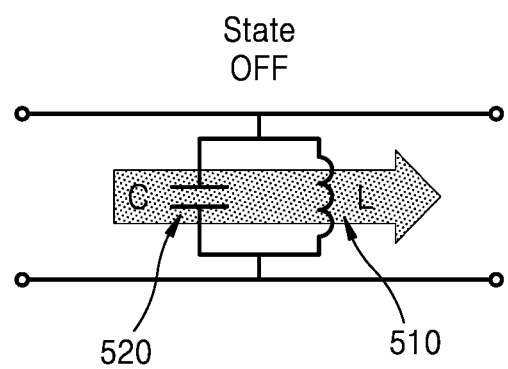
FIG. 16 is an equivalent circuit of the high frequency switch of FIG. 14 in an OFF state.
Figure 17:
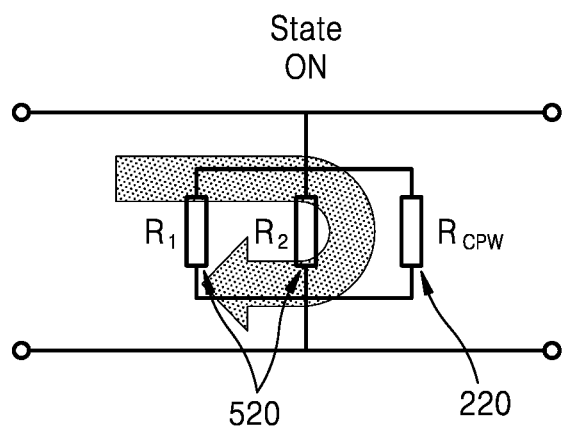
FIG. 17 is an equivalent circuit of the high frequency switch of FIG. 14 in an ON state.
Figure 18:
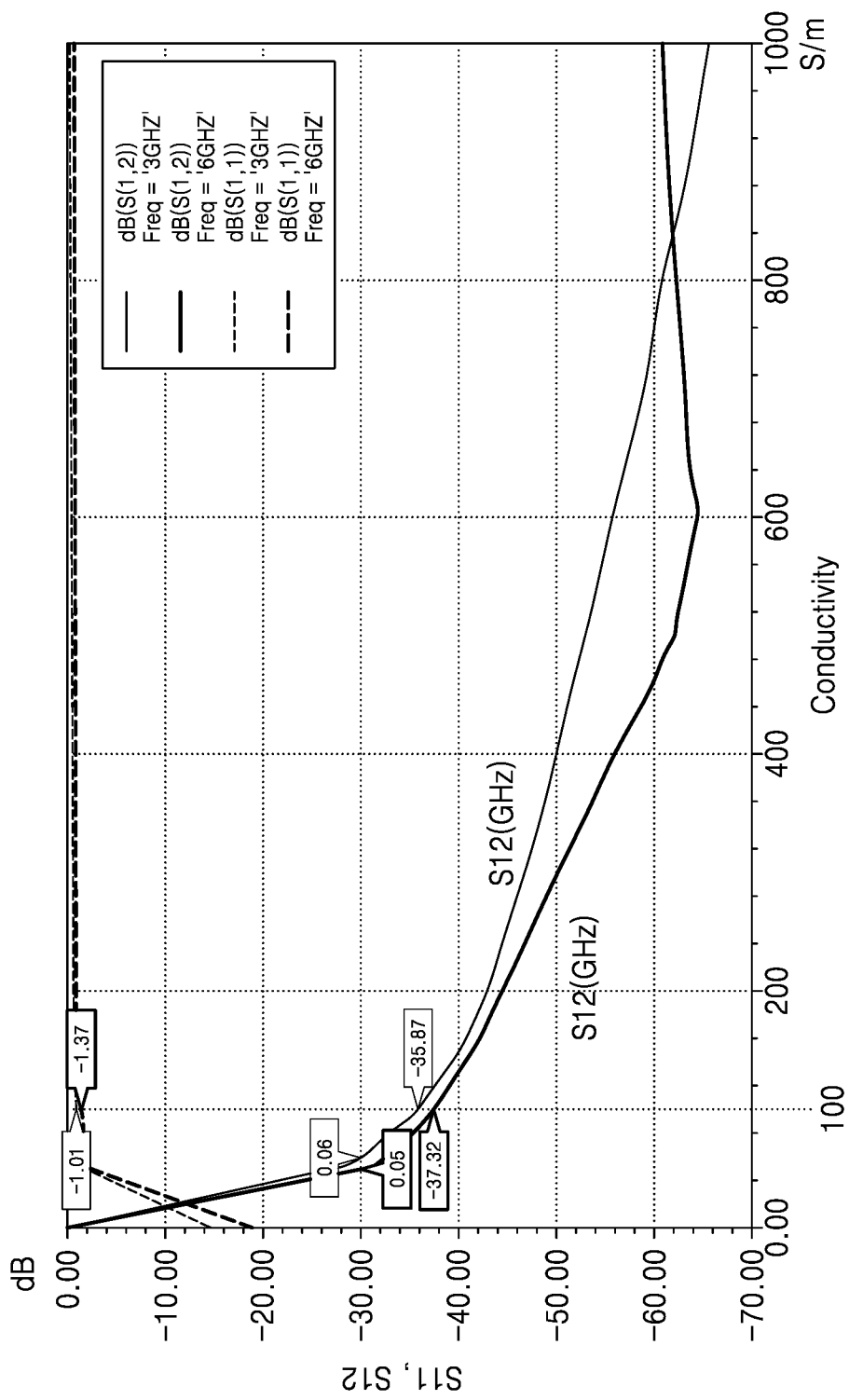
FIG. 18 illustrates simulation results of operations of a high frequency switch according to frequencies.

FIG. 14 illustrates a high frequency switch 12 according to an embodiment. FIG. 15 is a plan view of FIG. 14. FIG. 16 is an equivalent circuit of the high frequency switch 12 of FIG. 14 in an OFF state. FIG. 17 is an equivalent circuit of the high frequency switch 12 of FIG. 14 in an ON state. FIG. 18 illustrates simulation results of operations of the high frequency switch 12 according to frequencies. For conciseness, descriptions that are similar to those of FIGS. 1, 2A and 2B may not be repeated.

Unlike FIGS. 1, 2A and 2B, referring to FIGS. 14 and 15, the high frequency switch 12 may further include matching inductance elements 510 and capacitive stubs 520, which may be connected to the center conductor 220 in parallel. The capacitive stubs 520 may respectively extend from the matching inductance elements 510.

The photoconductive semiconductor elements 300 may extend and fill regions between the center conductor 220, the pair of ground sections 210, and the capacitive stubs 520, and may contact the substrate 100 between the center conductor 220, the pair of ground sections 210, and the capacitive stubs 520.

Referring to FIG. 16, the equivalent circuit of the high frequency switch 12 in the OFF state is shown. The matching inductance 510 and the capacitive stub 520 may respectively have functions of an inductor and a capacitor with respect to a high frequency current, and may be matched to each other and form a resonance structure. The matching inductance elements 510 and the capacitive stubs 520 may not affect propagation of electromagnetic waves in some frequency bands. When the high frequency switch 12 is in the OFF state, the electromagnetic waves may propagate with minimal loss.

Referring to FIG. 17, the equivalent circuit of the high frequency switch 12 in the ON state is shown. When control light is irradiated on the photoconductive semiconductor element 300, the photoconductive semiconductor element 300 may become conductive. The center conductor 220 and the capacitive stubs 520 may be electrically connected to the pair of ground sections 210 by the photoconductive semiconductor element 300, and may have parallel resistance. Accordingly, combined resistance of the high frequency switch 12 may be decreased, thereby resulting in improved blocking performance of the high frequency switch 12.

Referring to FIG. 18, the transmission factors S12 and the reflection factors S11 with respect to a 3 GHz signal and a 6 GHz signal are provided. The transmission factor S12 with respect to the 3 GHz signal is shown in a thin solid line, and the transmission factor S12 with respect to the 6 GHz signal is shown in a thick solid line. The reflection factor S11 with respect to the 3 GHz signal is shown in a thin dashed line, and the reflection factor S11 with respect to the 6 GHz signal is shown in a thick dashed line. When the conductivity of the photoconductive semiconductor element 300 is 100 S/m, the transmission factor S12 with respect to the 6 GHz signal is about −37 dB, and the transmission factor S12 with respect to the 3 GHz signal is about −36 dB. The transmission factor S12 of the high frequency switch 12 described with reference to FIGS. 1, 2A and 2B may be about −22 dB with respect to the 6 GHz signal when the conductivity of the photoconductive semiconductor element 300 is 100 S/m (see FIG. 13). The blocking performance of the high frequency switch 12 of this embodiment is greater than that of the high frequency switch 10 described with reference to FIGS. 1, 2A and 2B.

When the conductivity of the photoconductive semiconductor element 300 is 100 S/m, the reflection factor S11 of the high frequency switch 12 may be about −1 dB with respect to the 3 GHz and 6 GHz signals. The reflection factor S11 of the high frequency switch 10 described with reference to FIGS. 1, 2A and 2B may be about −3 dB with respect to the 6 GHz signal when the conductivity of the photoconductive semiconductor element 300 is 100 S/m (see FIG. 13). The reflection loss of the high frequency switch 12 of this embodiment is less than that of the high frequency switch 10 described with reference to FIGS. 1, 2A and 2B.

Figure 19:
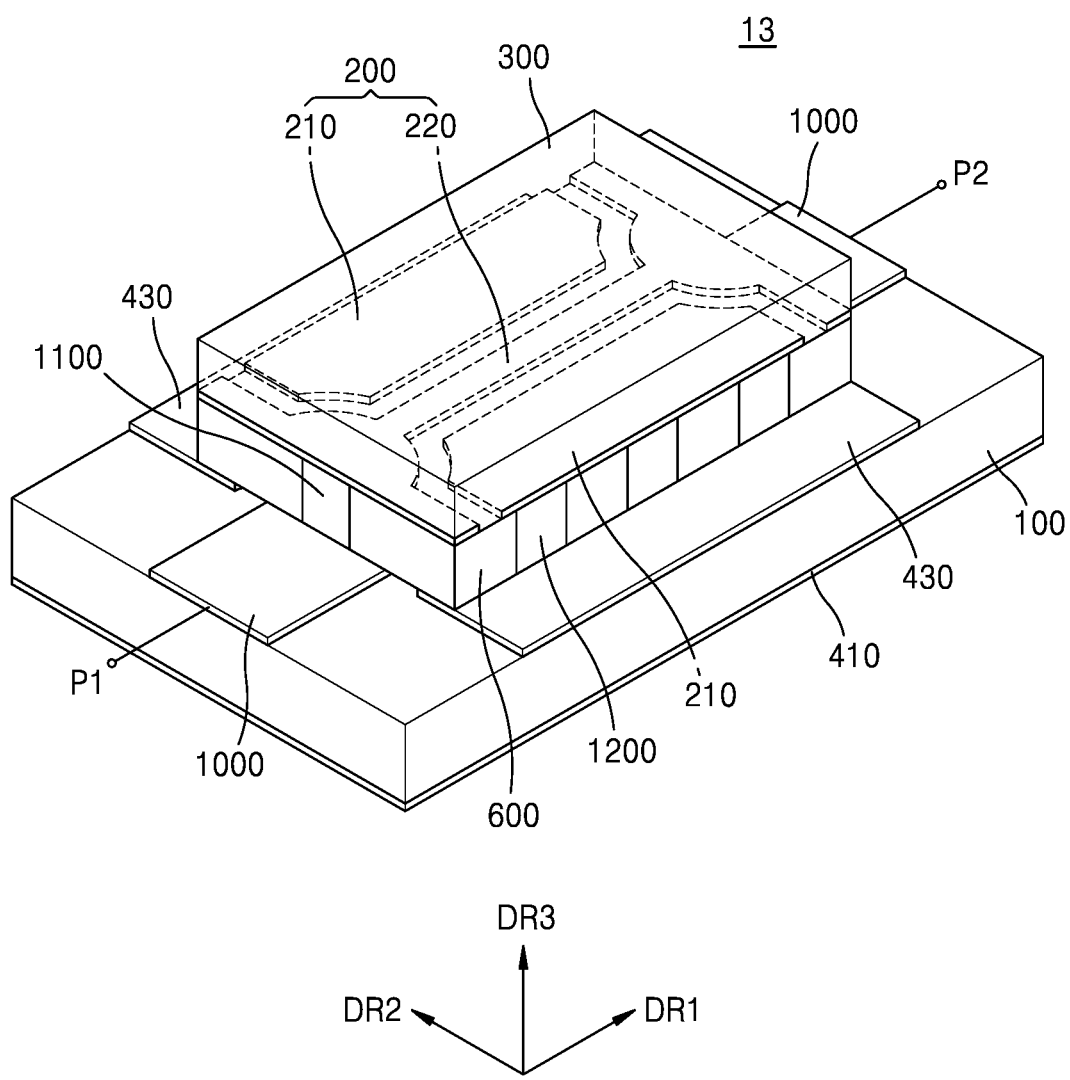
FIG. 19 illustrates a high frequency switch according to an embodiment.

FIG. 19 illustrates a high frequency switch 13 according to an embodiment. For conciseness, descriptions that are similar to those of FIGS. 1, 2A and 2B may not be repeated.

Referring to FIG. 19, the high frequency switch 13 may include the substrate 100, a pair of ground electrodes 430, the bottom ground layer 410, a dielectric layer 600, the coplanar waveguide line 200, first top contacts 1200, second top contacts 1100, and the photoconductive semiconductor element 300. The substrate 100 and the bottom ground layer 410 may be similar to those described with reference to FIGS. 1, 2A and 2B. The pair of ground electrodes 430 may be provided between the substrate 100 and the dielectric layer 600. The pair of ground electrodes 430 may be electrically connected to the bottom ground layer 410 by vias that may be similar to those described with reference to FIGS. 1, 2A and 2B.

The dielectric layer 600 may be provided on the substrate 100, and although illustrated to cover a part of the substrate 100, the dielectric layer 600 may entirely cover the substrate 100 as an alternative.

The coplanar waveguide line 200 may be provided on the dielectric layer 600 and may include the pair of ground sections 210 and the center conductor 220. The photoconductive semiconductor element 300 may be provided on the coplanar waveguide line 200. The coplanar waveguide line 200 and the photoconductive semiconductor element 300 may be similar to those described with reference to FIGS. 1, 2A and 2B.

The first top contacts 1200 may be provided between the pair of ground sections 210 and the pair of ground electrodes 430 and may electrically connect the pair of ground sections 210 and the pair of ground electrodes 430 to each other. For example, the first top contacts 1200 may directly contact the pair of ground sections 210 and the pair of ground electrodes 430 and may include a conductive material, such as Cu.

The pair of signal transmission lines 1000 may be provided on the substrate 100 between the substrate 100 and the dielectric layer 600, and may be similar to those described with reference to FIGS. 1, 2A and 2B.

The second top contacts 1100 may be provided between the pair of signal transmission lines 1000 and both end portions of the center conductor 220, and may electrically connect the pair of signal transmission lines 1000 and the both end portions of the center conductor 220 to each other. For example, the second top contacts 1100 may directly contact the pair of signal transmission lines 1000 and the both end portions of the center conductor 220, and may include a conductive material, such as Cu.

Figure 20:
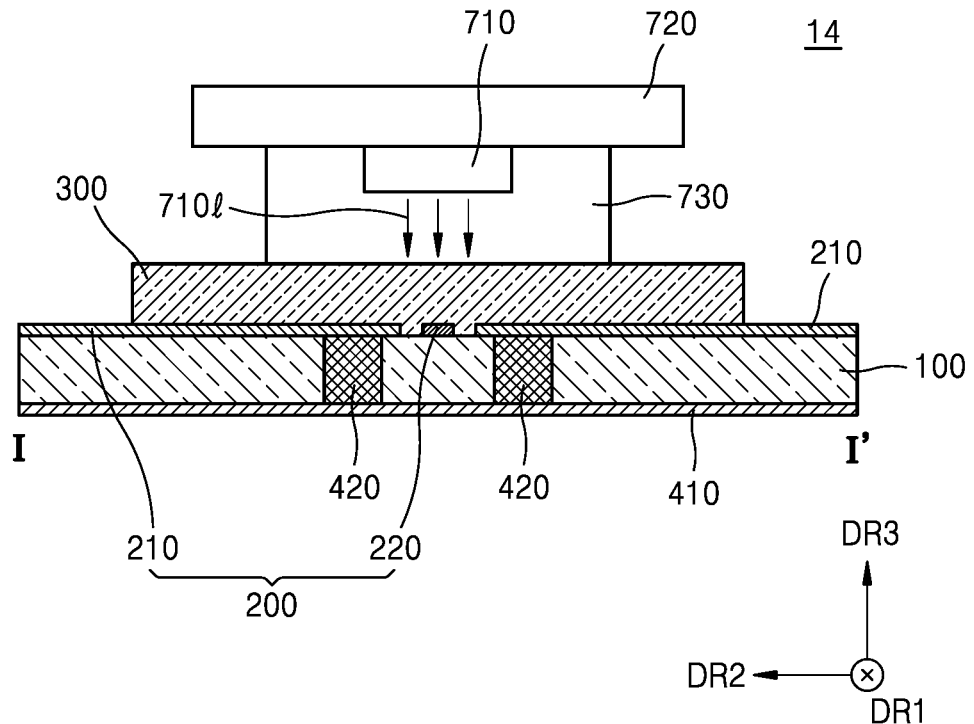
FIG. 20 is a cross-sectional view of a high frequency switch according to an embodiment, which corresponds to line I-I' of FIG. 1.

FIG. 20 is a cross-sectional view of a high frequency switch 14 according to an embodiment, which corresponds to line I-I' of FIG. 1. For conciseness, descriptions that are similar to those of FIGS. 1, 2A and 2B may not be repeated.

Referring to FIG. 20, the high frequency switch 14 including the substrate 100, the coplanar waveguide line 200, the photoconductive semiconductor element 300, the bottom ground layer 410, the vias 420, a light source 710, a controller 720, and a spacer 730 is provided. The substrate 100, the coplanar waveguide line 200, the photoconductive semiconductor element 300, the bottom ground layer 410, and the vias 420 may be similar to those described with reference to FIGS. 1, 2A and 2B.

The light source 710 may emit control light 710I to the photoconductive semiconductor element 300. For example, the light source 710 may include at least one of a light emitting diode (LED), a laser, or a laser diode. A working wavelength of the light source 710 (i.e., a wavelength of the control light 710I) may be selected based on absorption capability of the photoconductive semiconductor element 300. For example, the working wavelength of the light source 710 may be materially identical to a maximum absorption wavelength of the photoconductive semiconductor element 300. When the photoconductive semiconductor element 300 includes Si, the photoconductive semiconductor element 300 may have the maximum absorption wavelength at a near infrared ray (IR) range, such as about 940 nm. The light source 710 may be controlled by the controller 720. When the high frequency switch 14 is in the OFF state, the controller 720 may control the light source 710 not to emit the control light 710I. When the high frequency switch 14 is in the ON state, the controller 720 may control the light source 710 to emit the control light 710I. The controller 720 may include a PCB on which a control circuit is mounted.

The spacer 730 may uniformly maintain a distance between the photoconductive semiconductor element 300 and the light source 710 and may include a transparent dielectric material.

Figure 21:
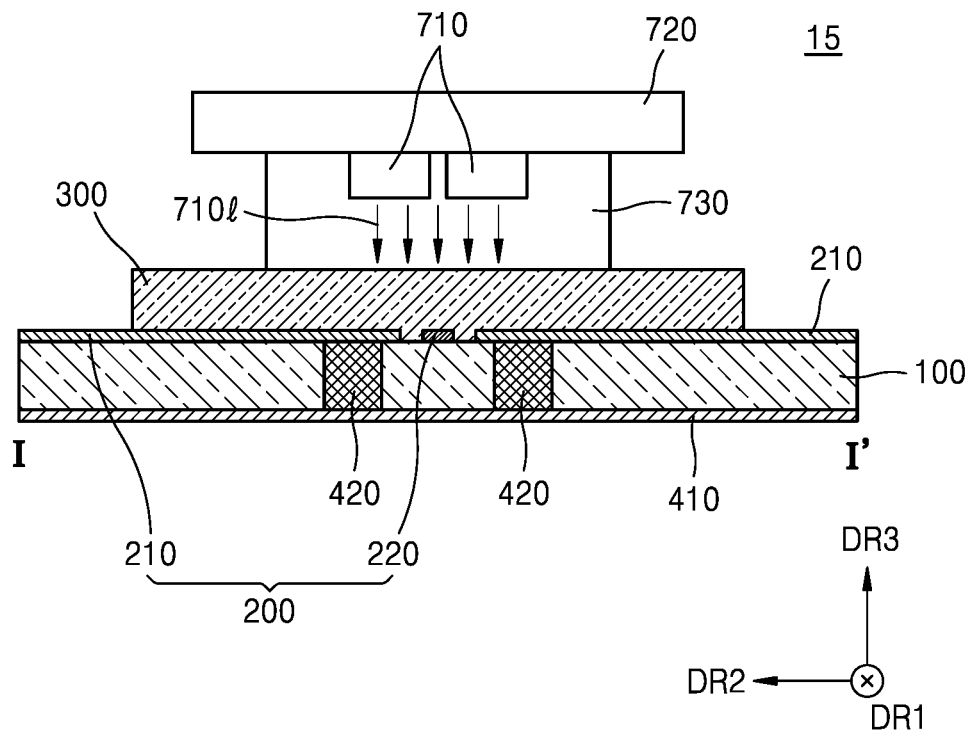
FIG. 21 is a cross-sectional view of a high frequency switch according to an embodiment, which corresponds to line I-I' of FIG. 1.

FIG. 21 is a cross-sectional view of a high frequency switch 15 according to an embodiment, which corresponds to line I-I' of FIG. 1. For conciseness, descriptions that are similar to those described with reference to FIGS. 1, 2A and 2B and 20 may not be repeated.

Referring to FIG. 21, the high frequency switch 15 may include the substrate 100, the coplanar waveguide line 200, the photoconductive semiconductor element 300, the bottom ground layer 410, the vias 420, a plurality of light sources 710, the controller 720, and the spacer 730. The substrate 100, the coplanar waveguide line 200, the photoconductive semiconductor element 300, the bottom ground layer 410, and the vias 420 may be similar to those described with reference to FIGS. 1, 2A and 26.

Unlike FIG. 20, the plurality of the light sources 710 may be provided in FIG. 21. The control light 710I emitted from the plurality of light sources 710 may be irradiated on a wider area of the photoconductive semiconductor element 300 than control light emitted from one light source. Accordingly, conductive distribution of the photoconductive semiconductor element 300 irradiated by the control light 710I emitted from the plurality of light sources 710 may be more uniform than conductive distribution of the photoconductive semiconductor element 300 irradiated by the control light 710I emitted from one light source 710.

Figure 22:
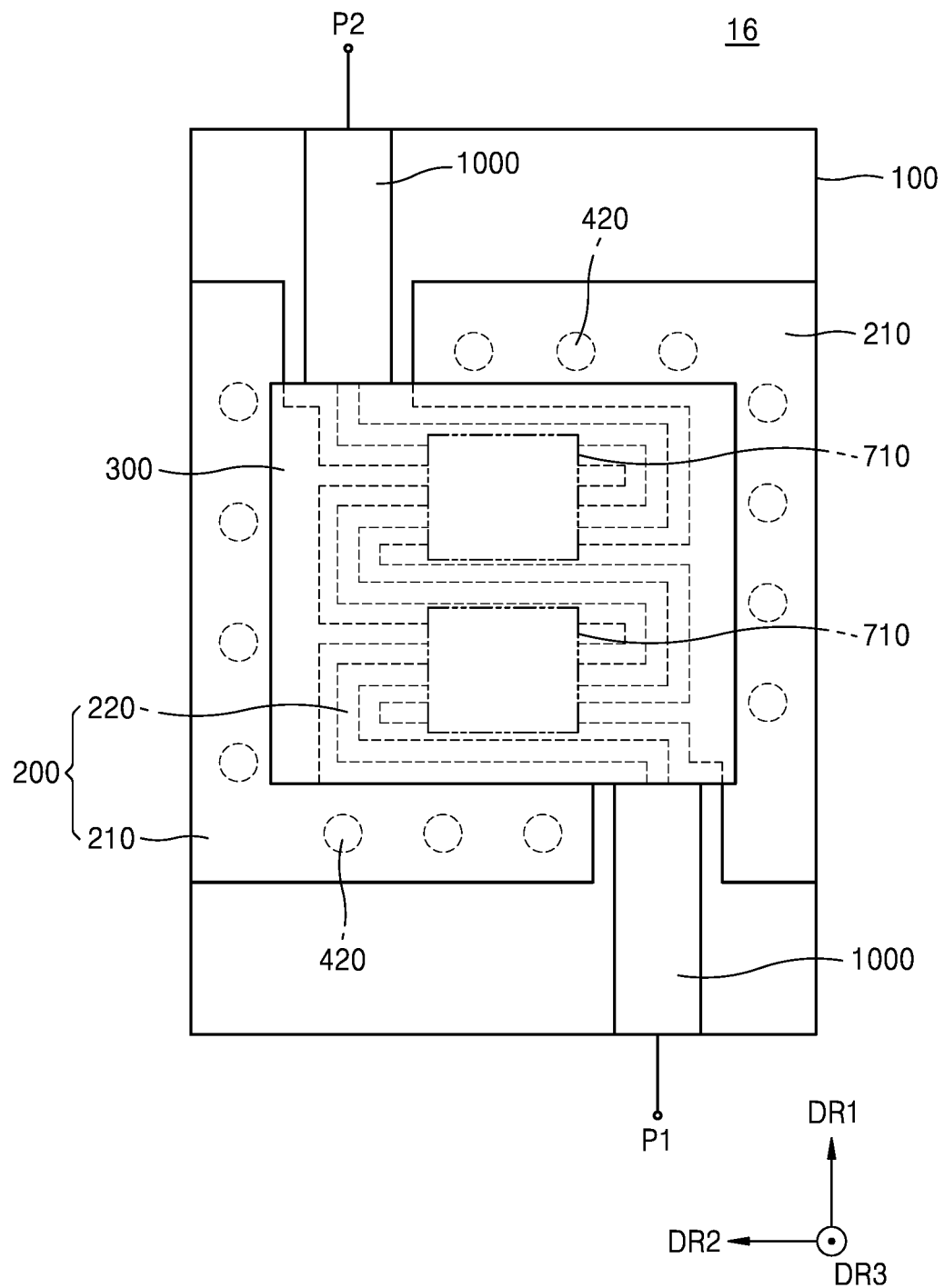
FIG. 22 is a plan view of a high frequency switch according to an embodiment.

FIG. 22 is a plan view of a high frequency switch 16 according to an embodiment. For conciseness, descriptions that are similar to those described with reference to FIGS. 10, 11, and 20 may not be repeated.

Referring to FIG. 22, the high frequency switch 16 may include the substrate 100, the coplanar waveguide line 200, the photoconductive semiconductor element 300, and the pair of light sources 710. The substrate 100, the coplanar waveguide line 200, and the photoconductive semiconductor element 300 may be similar to those described with reference to FIGS. 10 and 11.

Unlike FIG. 20, the pair of light sources 710 may be provided. The control light 710I emitted from the pair of light sources 710 may be irradiated on a wider area of the photoconductive semiconductor element 300 than control light emitted from one light source. Accordingly, conductive distribution of the photoconductive semiconductor element 300 irradiated by the control light 710I emitted from the pair of light sources 710 may be more uniform than conductive distribution of the photoconductive semiconductor element 300 irradiated by the control light 710I emitted from one light source 710.

Figure 23:
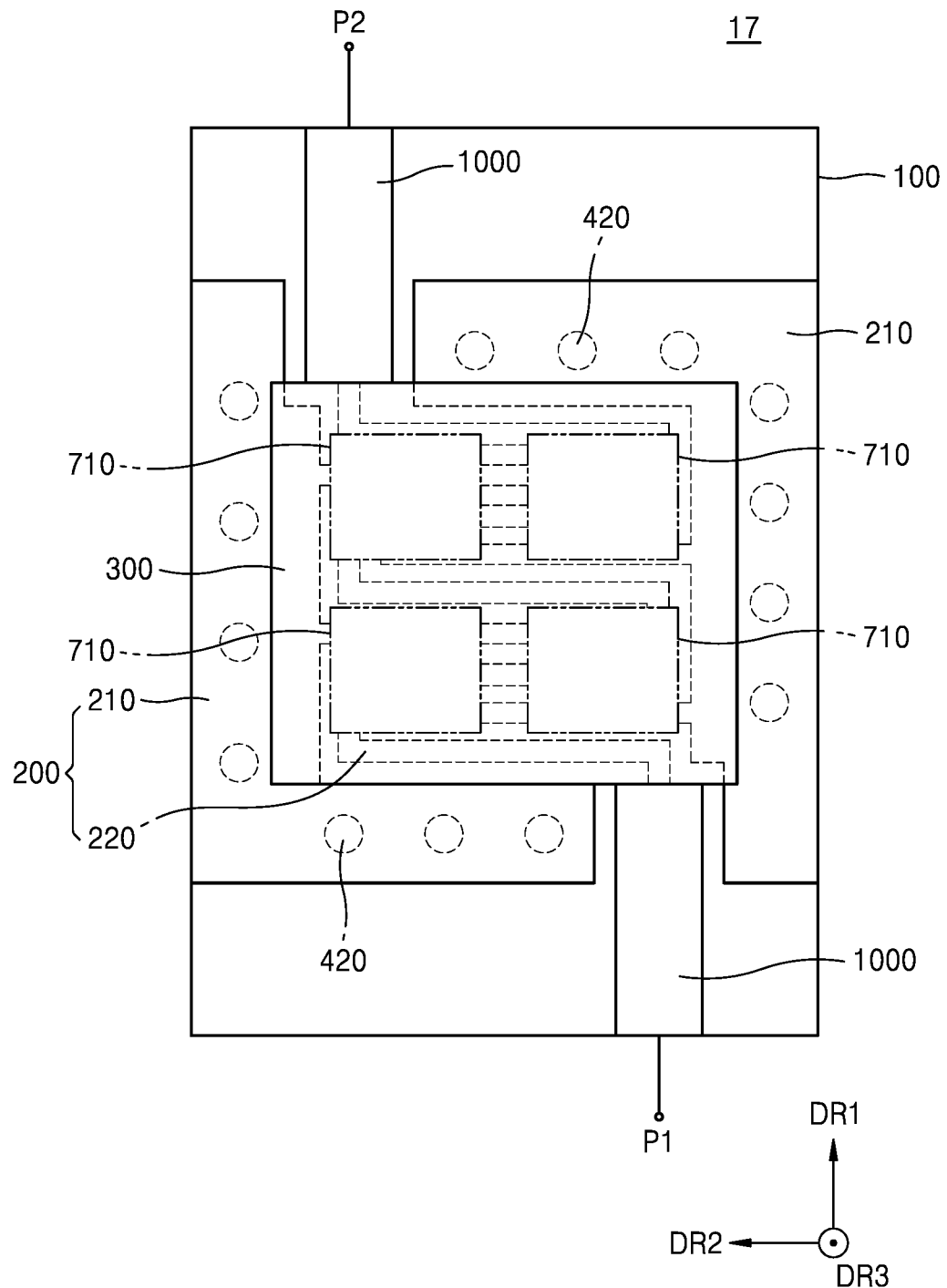
FIG. 23 is a plan view of a high frequency switch according to an embodiment.

FIG. 23 is a plan view of a high frequency switch 17 according to an embodiment. For conciseness, descriptions that are materially identical as those described with reference to FIGS. 10, 11, and 20 may not be repeated.

Referring to FIG. 23, the high frequency switch 17 may include the substrate 100, the coplanar waveguide line 200, the photoconductive semiconductor element 300, and a plurality of light sources 710. The substrate 100, the coplanar waveguide line 200, and the photoconductive semiconductor element 300 may be similar to those described with reference to FIGS. 10 and 11.

Unlike FIG. 20, the four light sources 710 may be provided. The control light 710I emitted from the four light sources 710 may be irradiated on a wider area of the photoconductive semiconductor element 300 than control light emitted from one light source. Accordingly, conductive distribution of the photoconductive semiconductor element 300 irradiated by the control light 710I emitted from the four light sources 710 may be more uniform than conductive distribution of the photoconductive semiconductor element 300 irradiated by the control light 710I emitted from one light source 710.

Figure 24:
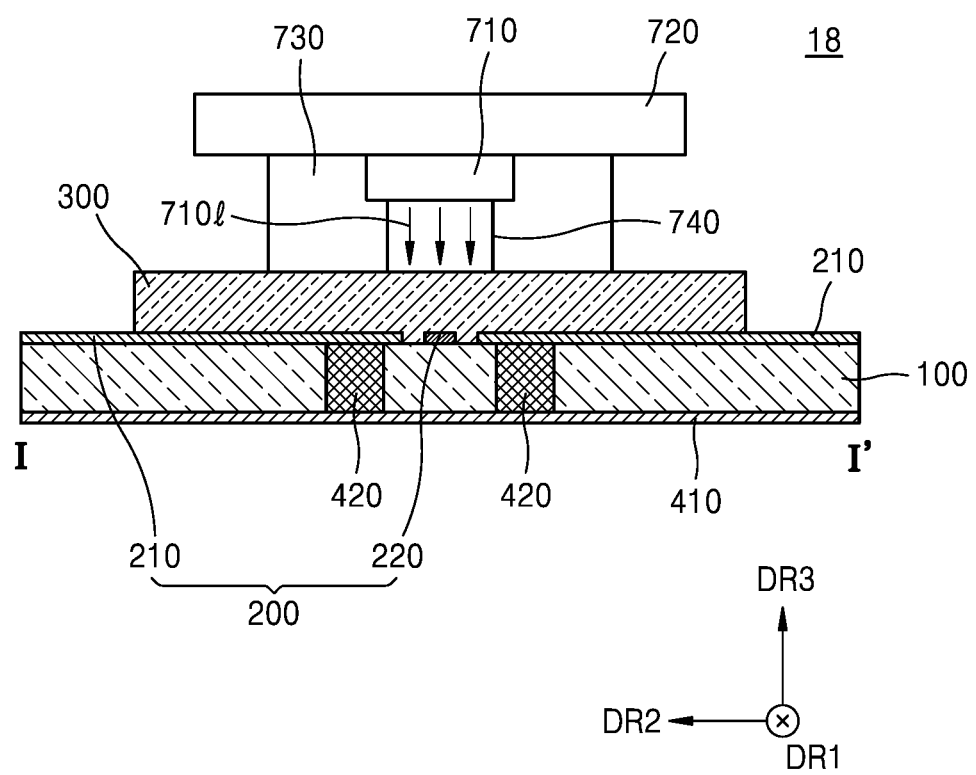
FIG. 24 is a cross-sectional view of a high frequency switch which corresponds to line I-I' of FIG. 1, according to an embodiment.

FIG. 24 is a cross-sectional view of a high frequency switch 18 according to an embodiment, which corresponds to line I-I' of FIG. 1. For conciseness, descriptions that are similar to those described with reference to FIGS. 1, 2A and 2B and 20 may not be repeated.

Referring to FIG. 24, the high frequency switch 18 may include the substrate 100, the coplanar waveguide line 200, the photoconductive semiconductor element 300, the bottom ground layer 410, the vias 420, the light source 710, the controller 720, and the spacer 730. The substrate 100, the coplanar waveguide line 200, the photoconductive semiconductor element 300, the bottom ground layer 410, and the vias 420 may be similar to those described with reference to FIGS. 1, 2A and 2B.

Unlike FIG. 20, referring to FIG. 24, the high frequency switch 18 may further include an optical fiber 740. The control light 710I emitted from the light source 710 may reach the photoconductive semiconductor element 300 through the optical fiber 740. According to an embodiment, the high frequency switch 18 may include an optical waveguide instead of the optical fiber 740.

While the present disclosure has been shown and described with reference to certain embodiments thereof, it will be understood by those skilled in the art that various changes in form and details may be made therein without departing from the spirit and scope of the disclosure as defined by the appended claims and their equivalents.

What is claimed is:

1. A high frequency switch comprising:
a substrate;
a pair of ground sections provided on the substrate;
a center conductor provided between the pair of ground sections;
a photoconductive semiconductor element provided on the center conductor and extending between the center conductor and the pair of ground sections; and
a pair of signal transmission lines provided on the substrate,
wherein the center conductor is continuously extended from one of the pair of signal transmission lines to the other one of the pair of signal transmission lines,
wherein the pair of signal transmission lines are respectively electrically connected to both end portions of the center conductor, and
wherein a width of each of the pair of signal transmission lines is greater than a width of the center conductor.

2. The high frequency switch of claim 1,
wherein the photoconductive semiconductor element fills regions between the center conductor and the pair of ground sections.

3. The high frequency switch of claim 1,
wherein the center conductor has a line shape extending in one direction parallel to a top surface of the substrate.

4. The high frequency switch of claim 1, further comprising:
a bottom ground layer covering a bottom surface of the substrate; and
a plurality of vias electrically connecting the bottom ground layer and the pair of ground sections to each other,
wherein the plurality of vias penetrate the substrate.

5. The high frequency switch of claim 1, further comprising:
a dielectric layer provided between the substrate and the pair of ground sections;
a pair of ground electrodes provided between the substrate and the dielectric layer; and
a plurality of ground vias electrically connecting the pair of ground sections and the pair of ground electrodes to each other,
wherein the center conductor is provided on the dielectric layer and the plurality of ground vias penetrate the dielectric layer.

6. The high frequency switch of claim 5, further comprising:
wherein the pair of signal transmission lines provided between the substrate and the dielectric layer,
wherein a plurality of signal transmission vias electrically connecting the pair of signal transmission lines and two end portions of the center conductor to each other, and
wherein the plurality of signal transmission vias penetrate the dielectric layer.

7. The high frequency switch of claim 1,
wherein the center conductor extends non-linearly.

8. The high frequency switch of claim 1, further comprising:
a plurality of capacitive stubs; and
a plurality of matching inductance elements,
wherein the plurality of capacitive stubs and the plurality of matching inductance elements are impedance-matched to each other.

9. The high frequency switch of claim 8,
wherein the capacitive stubs extend respectively from the matching inductance elements.

10. A high frequency switch comprising:
a pair of ground sections;
a center conductor provided between the pair of ground sections;
a photoconductive semiconductor element provided on the center conductor and extending between the center conductor and the pair of ground sections;
a light source irradiating control light on the photoconductive semiconductor element; and
a pair of signal transmission lines provided on a substrate,
wherein the center conductor is continuously extended from one of the pair of signal transmission lines to the other one of the pair of signal transmission lines,
wherein the pair of signal transmission lines are respectively electrically connected to both end portions of the center conductor, and
wherein a width of each of the pair of signal transmission lines is greater than a width of the center conductor.

11. The high frequency switch of claim 10,
wherein the light source is provided on the photoconductive semiconductor element.

12. The high frequency switch of claim 10,
wherein the light source is provided by a plurality of light sources.

13. The high frequency switch of claim 10, further comprising a controller configured to control an operation of the light source emitting the control light.

14. The high frequency switch of claim 10, further comprising an optical fiber provided between the light source and the photoconductive semiconductor element,
wherein the optical fiber transmits the control light to the photoconductive semiconductor element.

15. A high frequency switch comprising:
a substrate;
a pair of signal transmission lines provided on the substrate;
a photoconductive semiconductor element provided on the substrate; and
a coplanar waveguide line provided between the substrate and the photoconductive semiconductor element,
wherein, when control light is irradiated on the photoconductive semiconductor element, electromagnetic waves propagated to the coplanar waveguide line are reflected, and
wherein, when the control light is blocked from being irradiated on the photoconductive semiconductor element, the electromagnetic waves are passed through the high frequency switch,
wherein the coplanar waveguide line comprises a pair of ground sections and a center conductor provided between the pair of ground sections,
wherein the center conductor is continuously extended from one of the pair of signal transmission lines to the other one of the pair of signal transmission lines,
wherein the pair of signal transmission lines are respectively electrically connected to both end portions of the center conductor, and wherein a width of each of the pair of signal transmission lines is greater than a width of the center conductor.

16. The high frequency switch of claim 15, wherein a wavelength band of the control light comprises a maximum absorption wavelength of the photoconductive semiconductor element.

17. The high frequency switch of claim 15,
wherein the photoconductive semiconductor element extends between the center conductor and the pair of ground sections, and
wherein a ground voltage is applied to the pair of ground sections.

18. The high frequency switch of claim 17,
wherein, when the control light is irradiated on the photoconductive semiconductor element, the center conductor is electrically connected to the pair of ground sections by the photoconductive semiconductor element between the center conductor and the pair of ground sections, and
wherein, when the control light is blocked from being irradiated on the photoconductive semiconductor element, the center conductor and the pair of ground sections are disconnected from each other by the photoconductive semiconductor element.

19. The high frequency switch of claim 15, further comprising a light source irradiating the control light on the photoconductive semiconductor element.

* * * * *